(12) United States Patent
Yang et al.

(10) Patent No.: US 10,838,028 B2
(45) Date of Patent: Nov. 17, 2020

(54) DECOUPLING MAGNETIC RESONANCE IMAGING (MRI) RADIO FREQUENCY (RF) COIL ELEMENTS WITH HIGH ACCELERATION FACTOR IN PARALLEL TRANSMIT (PTX) OR RECEIVE (RX) COILS USING FEWER CHANNELS

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Haoqin Zhu, Mayfield Village, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 290 days.

(21) Appl. No.: 16/009,546

(22) Filed: Jun. 15, 2018

(65) Prior Publication Data

US 2018/0364318 A1 Dec. 20, 2018

Related U.S. Application Data

(60) Provisional application No. 62/521,770, filed on Jun. 19, 2017.

(51) Int. Cl.
*G01R 33/36* (2006.01)
(52) U.S. Cl.
CPC ....... *G01R 33/365* (2013.01); *G01R 33/3628* (2013.01); *G01R 33/3664* (2013.01); *G01R 33/3642* (2013.01)
(58) Field of Classification Search
CPC .............. G01R 33/3628; G01R 33/365; G01R 33/3642; G01R 33/3664; G01R 33/36;
(Continued)

(56) References Cited

U.S. PATENT DOCUMENTS 4,680,549 A 7/1987 Tanttu
4,825,162 A 4/1989 Roemer et al.
(Continued)

FOREIGN PATENT DOCUMENTS

WO 20150043612 A1 4/2015

OTHER PUBLICATIONS

Non-Final Office Action dated Nov. 18, 2019 in connection with U.S. Appl. No. 15/706,005.
(Continued)

*Primary Examiner* — Jermele M Hollington
*Assistant Examiner* — Suresh K Rajaputra
(74) *Attorney, Agent, or Firm* — Eschweiler & Potashnik, LLC

(57) ABSTRACT

An MRI RF coil array for use in a multi-channel MRI system, comprising a plurality of coils arranged in a M by N array, the number of columns corresponding with the number of channels in the MRI system. Columns are aligned with the $B_0$ field. The plurality of coils are configured as a plurality of combined coils, corresponding with the number of columns, comprising a coil in a first row of the array connected with a coil in each of the remaining rows. The column position of each coil of a combined coil is distinct from the column position of each other coil of the combined coil. Coils of a combined coil are disjoint from the coils of each, other, combined coil. A combined coil is configured to connect with a corresponding member of the plurality of Rx channels, and is decoupled from each, other combined coil.

25 Claims, 13 Drawing Sheets

(58) Field of Classification Search
CPC .... G01R 33/561; G01R 33/56; G01R 33/565; G01R 33/54; G01R 33/4833
See application file for complete search history.

(56) References Cited

U.S. PATENT DOCUMENTS

| | | | |
|---|---|---|---|
| 4,987,370 | A | 1/1991 | Leussler et al. |
| 5,355,087 | A | 10/1994 | Claiborne et al. |
| 5,386,191 | A | 1/1995 | McCarten |
| 5,455,595 | A | 10/1995 | Yokoyama |
| 5,777,474 | A | 7/1998 | Srinivasan |
| 5,903,150 | A | 5/1999 | Roznitsky |
| 5,910,728 | A | 6/1999 | Sodickson |
| 6,177,797 | B1 | 1/2001 | Srinivasan |
| 6,249,121 | B1 | 6/2001 | Boskamp |
| 6,323,648 | B1 | 11/2001 | Belt |
| 6,529,005 | B1 | 3/2003 | Kasten |
| 6,791,328 | B1 | 9/2004 | Nabetani |
| 6,982,554 | B2 | 1/2006 | Kurpad et al. |
| 7,180,296 | B2 | 2/2007 | Gross |
| 7,663,367 | B2 | 2/2010 | Wiggins |
| 9,097,769 | B2 | 8/2015 | Schillak |
| 9,274,189 | B2 | 1/2016 | Soutome |
| 9,459,331 | B2 | 10/2016 | Otake |
| 9,541,614 | B2 | 1/2017 | Soutome |
| 9,638,771 | B2 | 5/2017 | Soutome |
| 9,880,242 | B2 | 1/2018 | Darnell |
| 10,168,402 | B2 | 1/2019 | Gunamony |
| 10,261,145 | B2 | 4/2019 | Wald |
| 10,324,147 | B2 | 6/2019 | McNulty |
| 2002/0169374 | A1 | 11/2002 | Jevtic |
| 2006/0071661 | A1 | 4/2006 | Ong |
| 2009/0121482 | A1 | 5/2009 | Rickard |
| 2010/0213941 | A1 | 8/2010 | Driesel et al. |
| 2011/0043209 | A1* | 2/2011 | Zhu ................ G01R 33/365 324/322 |
| 2011/0118723 | A1 | 5/2011 | Turner |
| 2012/0223709 | A1 | 9/2012 | Schillak et al. |
| 2012/0262173 | A1 | 10/2012 | Soutome et al. |
| 2012/0326515 | A1 | 12/2012 | Murai |
| 2013/0063147 | A1 | 3/2013 | Findeklee |
| 2013/0093425 | A1* | 4/2013 | Chu ................. G01R 33/365 324/318 |
| 2013/0119991 | A1 | 5/2013 | Soutome et al. |
| 2013/0314091 | A1 | 11/2013 | Otake et al. |
| 2015/0260821 | A1 | 9/2015 | Biber |
| 2015/0323628 | A1 | 11/2015 | Wald et al. |
| 2015/0338478 | A1 | 11/2015 | Schillak et al. |
| 2016/0116556 | A1 | 4/2016 | Darnell |
| 2016/0209481 | A1 | 7/2016 | Gunamony et al. |
| 2016/0231400 | A1 | 8/2016 | Fath et al. |
| 2016/0254705 | A1 | 9/2016 | Jung |
| 2016/0334479 | A1 | 11/2016 | Poole et al. |
| 2017/0146622 | A1 | 5/2017 | Yang et al. |
| 2018/0081008 | A1 | 3/2018 | Yang |
| 2018/0275226 | A1 | 9/2018 | Yang |
| 2018/0275233 | A1 | 9/2018 | Yang |
| 2018/0275234 | A1 | 9/2018 | Han et al. |
| 2018/0313918 | A1 | 11/2018 | Yang |
| 2018/0321339 | A1 | 11/2018 | Yang |
| 2018/0364318 | A1 | 12/2018 | Yang |
| 2020/0065020 | A1 | 2/2020 | Tai |

OTHER PUBLICATIONS

W. Wang, et al., "Inductive Coupled Local TX Coil Design", Proc. Intl. Soc. Mag. Reson. Med. 18 (2010).
International Search Report and Written Opinion dated Nov. 9, 2017 in connection with International Patent Application No. PCT/US2017/042590.
Wang J., "A Novel Method to Reduce the Signal Coupling of Surface Coils for MRI", Proc. ISMRM 4:1434 (1996).
Jovan Jevtic, "Ladder Networks for Capacitive Decoupling in Phased-Array Coils", Proc. Intl. Soc. Mag. Reson. Med 9 (2001).
Klaas P. Pruessmann et al, "SENSE: Sensitivity Encoding for Fast MRI", Magnetic Resonance in Medicine 42:952-962 (1999).
Ulrich Katscher et al, "Transmit SENSE", Magnetic Resonance in Medicine 49:144-150 (2003).
U.S. Appl. No. 15/706,005, filed Sep. 15, 2017.
U.S. Appl. No. 15/583,345, filed May 1, 2017.
U.S. Appl. No. 15/933,860, filed Mar. 23, 2018.
U.S. Appl. No. 15/923,437, filed Mar. 16, 2018.
U.S. Appl. No. 15/964,390, filed Apr. 27, 2018.
U.S. Appl. No. 15/971,075, filed May 4, 2018.
Notice of Allowance dated Jan. 10, 2020 in connection with U.S. Appl. No. 15/964,390.
Non-Final Office Action dated Nov. 8, 2018 in connection with U.S. Appl. No. 15/583,345.
Non-Final Office Action dated Aug. 13, 2020 in connection with U.S. Appl. No. 15/923,437.
Notice of Allowance dated Jul. 31, 2020 in connection with U.S. Appl. No. 15/706,005.

* cited by examiner

DECOUPLING MAGNETIC RESONANCE IMAGING (MRI) RADIO FREQUENCY (RF) COIL ELEMENTS WITH HIGH ACCELERATION FACTOR IN PARALLEL TRANSMIT (PTX) OR RECEIVE (RX) COILS USING FEWER CHANNELS

RELATED APPLICATIONS

This application claims priority to and the benefit of U.S. Provisional Patent Application 62/521,770, filed Jun. 19, 2017, which is incorporated herein in its entirety.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils create the $B_1$ field that rotates the net magnetization in a pulse sequence. RF coils may also detect precessing transverse magnetization. Thus, RF coils may be transmit (Tx) coils, receive (Rx) coils, or transmit and receive (Tx/Rx) coils. An imaging coil needs to be able to resonate at a selected Larmor frequency. Imaging coils include inductive elements and capacitive elements. The inductive elements and capacitive elements have been implemented according to existing approaches using two terminal passive components (e.g., capacitors). The resonant frequency, v, of an RF coil is determined by the inductance (L) and capacitance (C) of the inductor capacitor circuit according to:

$$v = \frac{1}{2\prod \sqrt{LC}}$$

Imaging coils may need to be tuned. Tuning an imaging coil may include varying the performance of a capacitor. Recall that frequency: $f=\omega/(2\pi)$, wavelength: $\lambda=c/f$, and $\lambda=4.7$ m at 1.5 T. Recall also that the Larmor frequency: $f_0=\gamma B_0/(2\pi)$, where $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

There are many design issues associated with MRI RF coil design. For example, the inductance of a conventional coil depends on the geometry of the coil. For a square coil with a side length a and wire diameter f: $L=[\mu_0/\pi]$ $[-4a+2a\sqrt{2}-2a \log(1+\sqrt{2})+2a \log(4a/f)]$. For a loop coil with loop diameter d and wire diameter f: $L=[\mu_0 d/2] [\log(8d/f)-2]$. Thus, the selection of the geometry of a coil determines, at least in part, the inductance of the coil.

The resistance of a coil also depends on the geometry of the coil. The resistance R of a conductor of length l and cross-sectional area A is $R=\rho l/A$, where $\rho$ is the conductor resistivity and is a property of the conductor material and the temperature. The resistance of coil may depend on, for example, the diameter of the loop, the wire diameter, copper foil thickness, or copper foil width. Thus, the selection of the geometry of a coil and the material (e.g., wire, foil) determines, at least in part, the inductance of the coil. The length of the loop also impacts the properties of the coil.

Coils may be used for transmitting RF energy that is intended to cause nuclear magnetic resonance (NMR) in a sample. The frequency at which NMR will be created depends on the magnetic field present in the sample. Both the main magnetic field $B_0$ produced by the MRI apparatus and the additional magnetic field $B_1$ produced by a coil contribute to the magnetic field present in the sample. For a circular loop coil, the transmit $B_1$ field equals the coil sensitivity. A circular loop of radius a carrying a current I produces on axis the field: $B=\mu_0 I a^2/[2(a^2+z^2)^{3/2}]$.

Additionally, RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

There are a number of complicated design issues associated with conventional RF coils. Existing approaches to coil design involve selecting and manipulating capacitors. The selection and manipulation depends on many factors including coil material (e.g., foil, wire), coil geometry (e.g., square, loop), fabrication technique (e.g., surface mount, etched onto printed circuit board) and other choices. Coil design is further complicated by the fact that splitting a coil with capacitors may affect radiation losses, dielectric losses, resistance, and fabrication issues (e.g., additional soldering).

Coils may use PIN diodes. When forward-biased, a PIN diode may produce a negligible resistance (e.g., 0.1Ω), which is essentially a short-circuit. When reverse-biased, a PIN diode may produce a high resistance (e.g., 200 kΩ) in parallel with a low capacitance (e.g., ~2 pF), which is essentially an open-circuit. Coils may also be designed with a single element or two or more elements. The number of elements may affect the properties of the coil. Additionally, the size, width, and material of the conductor may affect the properties of the coil.

Thus, existing coil design approaches may be a complicated process that requires numerous decisions. Additionally, existing approaches to coil fabrication may be a complicated process that requires accurately implementing manufactures that reflect the design decisions. Simpler and less costly approaches are constantly sought.

An MRI RF coil array may use multiple coil elements instead of one large coil element. As a result, MRI RF coil arrays may achieve higher signal to noise ratio (SNR) at a particular surface region of a subject being imaged while retaining similar SNR at deeper regions when compared to single-coil MRI coils. Since in a coil array there are more coil elements than in a single coil and each coil element is an LC resonant circuit, there is coupling among the coil elements. Existing approaches to decoupling coil elements from each other may use overlap among neighboring elements to minimize mutual inductive coupling among coil elements. In this approach, low input impedance preamplifiers may be used to further minimize the coupling among coil elements.

MRI applications may require the introduction of ever increasing numbers of coil elements into coil design. As a result, more approaches to isolate or electromagnetically decouple coil elements from each other have been introduced to make isolation easier. Some existing approaches include a transformer-like overlap approach, a capacitors approach, or a special network approach. These existing approaches are difficult to implement if the total number of coil elements are large. For example, if the total number of coil elements is 32, then we need to decouple 32*31/2=496 pairs of coils. This number is large enough that in a clinical setting, such decoupling is impractical, inconvenient for practitioners and patients, increases design complexity, and reduces the numbers of patients that may be imaged. Note that MRI coil arrays with larger numbers of elements (e.g., 32, 64, or more coil elements) are increasingly common, and the decoupling problem becomes increasing complicated. The coil performance of existing approaches thus does not realize the full potential of MRI coils that include arrays of multiple coil elements due to these problems.

MRI receiving may employ parallel imaging. Parallel imaging may increase scanning speed significantly. One of the requirements of parallel imaging in RF coil design is that the coil (i.e., coil array) needs to have many elements and each element needs to have its own localized field pattern. Thus, as parallel imaging becomes more commonly used, it further increases the industry demand for the total number of coil elements. This increases the complexity of MRI systems and MRI RF coils and arrays, further increasing the total cost of MRI coils and systems.

Parallel imaging approaches may be extended to MRI transmitting in addition to reception. Parallel imaging provides advantages in that it facilitates creating customized transmit field patterns by manipulating each coil element's transmitting current magnitude and phase. This further increases scanning speed. This has similar requirements with respect to RF coils, including localized fields. However, for transmitter power amplifiers the standard commercial amplifier is a 50 Ohm amplifier. There are no suitable low or high output impedance amplifiers available commercially. As a result this requires very good isolation among all coil elements if 50 Ohm RF power amplifiers are used. Thus pTx becomes extremely difficult to implement if the total number of elements is large (e.g., 32 elements, 64 elements). A current source approach may be employed to develop RF amplifiers for minimizing coupling. However, to date there are still no suitable commercial current source RF amplifiers available. This decoupling requirement limits the use of pTx. Furthermore, if an MRI system is a highly parallel pTx system, its cost is very expensive because of the amount and complexity of transmit (Tx) hardware and software that needs to be used. Thus there is a need for improved decoupling in MRI pTx applications.

DETAILED DESCRIPTION

Figure 1:
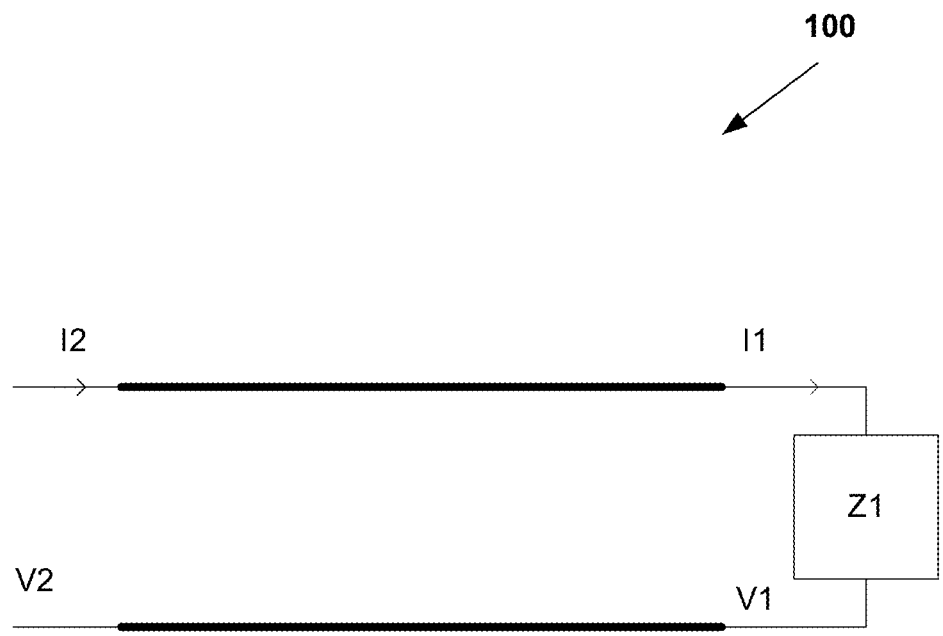
FIG. 1 illustrates an arbitrary length lossless transmission line with one side connected to a load.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments described herein facilitate decoupling coil elements in an MRI coil array and providing accelerated parallel Tx/Rx capability while using a smaller number of channels than existing approaches. In embodiments described herein, coil elements in an MRI coil array are electrically connected to each other to operate as one combined coil element. Coil elements electrically connected to operate as one combined coil element are configured to connect with a corresponding channel in a multiple channel MRI system. Embodiments provide techniques and circuitry for electrically connecting a plurality of coil elements using transmission lines such that a current through a first load at a first location in the plurality of coil elements is the same as the current through a second load at a second, different location in the plurality of coil elements. Embodiments thus facilitate extending decoupling effects from a first member of a plurality of coil elements to a second, different member of the plurality of coil elements that are electrically connected with each other to operate as one combined coil element.

A coil array may have M rows and N columns. Columns are aligned in the $B_0$ direction. The number of channels is defined by the number of columns N. Thus, an M by N coil array according to embodiments described herein has N combined coil elements configured to connect with N corresponding channels of an MRI system. For example, a 2 row by 4 column array according to embodiments described herein has eight individual coil elements, which result in four combined coil elements, where a combined coil element comprises a first element selected from the first row electrically connected with a second element selected from the second row, where the first element is not directly above the second element (i.e., the column position of the first element is different from the column position of the second element).

First we will discuss impedance transformation of an arbitrary length lossless transmission line. A transmission line may be used to connect coil elements in embodiments described herein. A transmission line may have many formats, such as coaxial cable, parallel line, microstrip, strip line, etc. Example MRI RF coils and MRI RF coil arrays may be, in some embodiments, implemented by using ¼ quarter wavelength or ½ wavelength transmission lines to connect two coils (e.g., LC circuits) together so that they act like one coil. Electrically connecting coils using ¼ quarter wavelength or ½ wavelength transmission lines is described in U.S. patent application Ser. No. 15/339,107, filed on Oct. 31, 2016, which is hereby incorporated herein by reference in its entirety.

Example MRI RF coils and MRI RF coil arrays may also be implemented using single layer coils in which the RF coils resonate with a whole body coil (WBC) in Tx mode to amplify the Tx field locally. A single-layer MRI RF coil array includes at least one single-layer MRI RF coil array element that may inductively couple with a primary coil. Upon the at least one single-layer MRI RF coil array element resonating with a primary coil, the single-layer MRI RF coil array generates a local amplified Tx field based on an induced current in the at least one single-layer MRI RF coil array element. The induced current is generated by inductive coupling between the at least one single-layer MRI RF coil array element and the primary coil. Single layer MRI RF coils and coil arrays are described in U.S. patent application Ser. No. 15/583,345 filed May 1, 2017, U.S. patent application Ser. No. 15/933,860, filed Mar. 23, 2018, and U.S. patent application Ser. No. 15/964,390, filed Apr. 27, 2018, which are hereby incorporated herein by reference in their entirety.

Assume there is a length of transmission line that has an intrinsic impedance of Z0 and that provides phase delay a at a working frequency $f_0$ of a primary coil of an MRI system. One side of the length of transmission line is connected to an impedance Z1, where Z1 can be complex. There are currents and voltages existing at both sides of the transmission line. An example of this situation is illustrated in FIG. 1. FIG. 1 illustrates an arbitrary length lossless transmission line 100 where one side of transmission line 100 connects to a load Z1. A first current I1, a second current I2, a first voltage V1, and a second voltage V2 are illustrated.

The ABCD matrix of a lossless transmission line is described by:

$$\begin{vmatrix} \cos(\alpha) & -jZ_0\sin(\alpha) \\ -j\frac{\sin(\alpha)}{Z_0} & \cos(\alpha) \end{vmatrix}.$$

Therefore, $$\begin{pmatrix} V1 \\ I1 \end{pmatrix} = \begin{vmatrix} \cos(\alpha) & -jZ_0\sin(\alpha) \\ -j\frac{\sin(\alpha)}{Z_0} & \cos(\alpha) \end{vmatrix} \begin{pmatrix} V2 \\ I2 \end{pmatrix} \quad \text{Eq. 1}$$

We also know that:

$V1 = I1 * Z1$ $V2 = I2 * Z2$ where Z2 is defined as V2/I2. From transmission line theory we know that $$Z2 = Z0 * \frac{Z1 * \cos(\alpha) + jZ0 * \sin(\alpha)}{Z0 * \cos(\alpha) + jZ1 * \sin(\alpha)} \quad \text{Eq. 2}$$

Solving equations Eq. 1 and Eq. 2 above results in:

$$\frac{I1}{I2} = \frac{Z0/Z1}{\left(\frac{Z0}{Z1}\right)\cos(\alpha) + j\sin(\alpha)} \quad \text{Eq. 3}$$

In this example, Z1 may be a complex load and the I1/I2 ratio may be a complex number. Embodiments use several properties of Eq. 3 to facilitate decoupling coil elements. First, if the transmission line is short, i.e., α is zero, then I1=I2. Second, if the transmission line length is quarter wavelength, i.e., a is 90 degrees, then I1/I2=−jZ0/Z1. If Z1=−jZ0, then I1/I2=1. To achieve I1/I2=1 for an arbitrary transmission line length, then:

$$Z1 = -jZ0 * \frac{1 - \cos(\alpha)}{\sin(\alpha)} \quad \text{Eq. 4}$$

Eq. 4 demonstrates that Z1's load may be tuned to an imaginary load so that the current in Z1 is the same as the current through Z2 at the same phase. In this situation there are thus two coils working as one coil. In this example and throughout, the definition of "one coil" or "one combined coil" means that the currents are the same at different locations of the combined coil. A more generic Eq. 4 can be written as:

$$Z1 = -jZ0 * \frac{1 - \frac{I1}{I2}\cos(\alpha)}{\frac{I1}{I2}\sin(\alpha)} \quad \text{Eq. 5}$$

Figure 2:
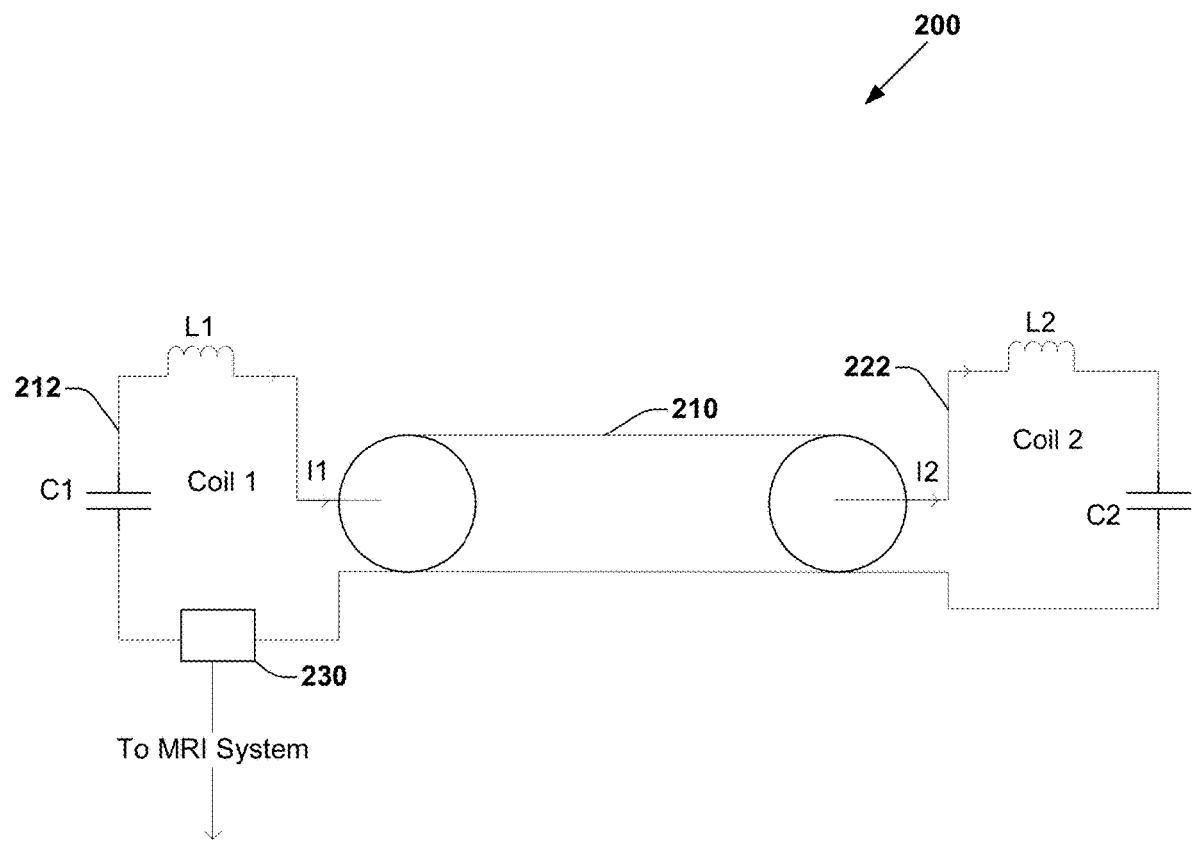
FIG. 2 illustrates MRI coil elements connected with an arbitrary length lossless transmission line.

Eq. 5 can be used if a different a magnitude or phase between I2 and I1 is desired. FIG. 2 is a coil block diagram of a two-loop MRI RF coil array 200 which illustrates properties described by Eq. 4 and Eq. 5. In embodiments described herein, coil 1 or coil 2 may be a loop coil, a saddle coil, or any LC resonant circuit configured for use as an MRI RF coil. For example, in this embodiment, coil 1 includes an inductor L1, a capacitor C1, the inductor L1 and the capacitor C1 connected by a conductor 212. Coil 1 further includes preamplifier decoupling circuitry 230. Coil 2 includes an inductor L2, a capacitor C2, the inductor L2 and the capacitor C2 connected by a conductor 222. In other embodiments, other configurations of coil may be employed. A transmission line 210 electrically connects coil 1 with coil 2. Since I1, I2, Z1 and Z0 need to satisfy Eq. 4 or Eq. 5, and if I1 is reduced by inserting a high impedance device in coil 1, such as preamplifier decoupling circuitry 230, I2 will decrease accordingly. Thus, coil 2 may be subject to the same preamplifier decoupling effect as coil 1 if coil 1 has preamplifier decoupling.

Figure 3:
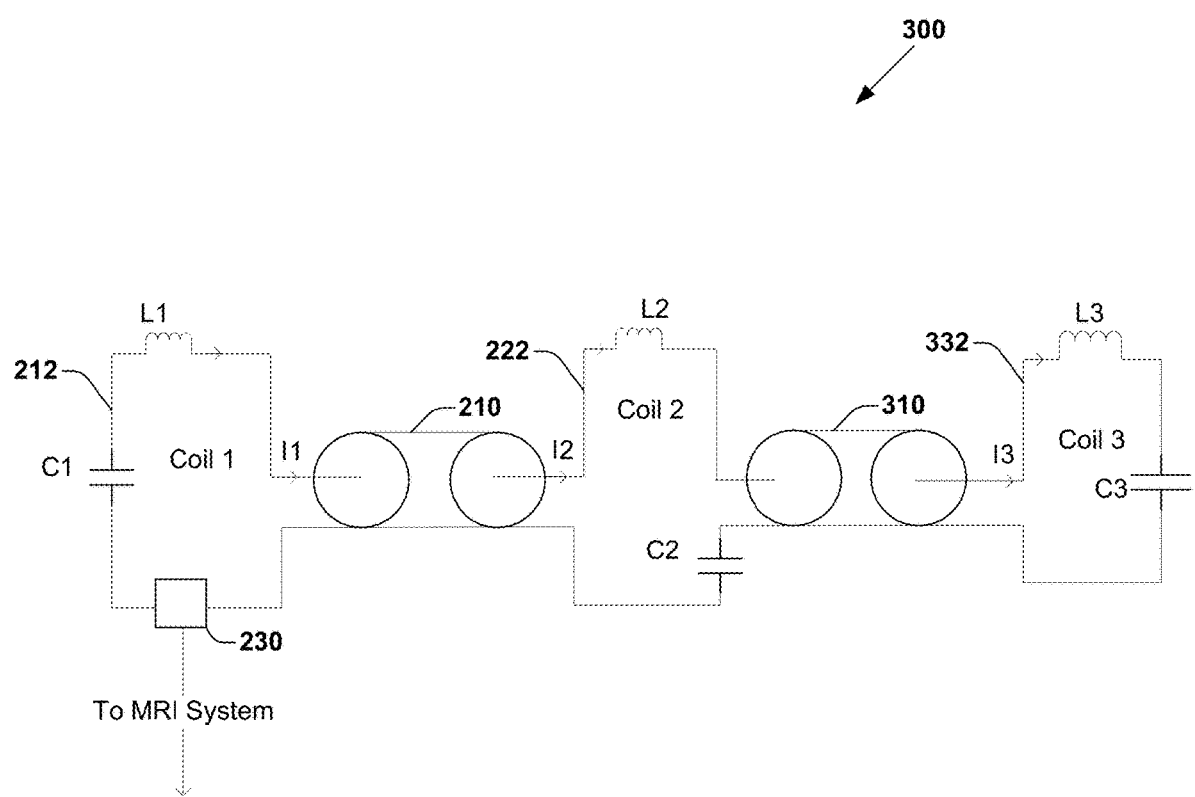
FIG. 3 illustrates MRI coil elements connected in series.

The approach illustrated in FIG. 2 can be extended to embodiments using more than two coils which still use the same principles described in Eq. 4 and 5. One way to do the expansion to more than two coils is to electrically connect coils in series. This approach is illustrated in FIG. 3. FIG. 3 is a coil block diagram of a three-loop MRI RF coil array 300 that is similar to two-loop MRI RF coil array 200 but that includes additional elements and details. Three-loop MRI RF coil array 300 further includes coil 3, which is similar to coil 1 or coil 2. Coil 3 may be, for example, a loop coil, a saddle coil, or any LC resonant circuit configured for use as an MRI RF coil. Coil 3 includes an inductor L3, a capacitor C3, where the inductor L3 and the capacitor C3 are connected by a conductor 332. Transmission line 310 electrically connects coil 2 with coil 3. Transmission line 310 has a phase delay beta. To tune the combined MRI RF coil array 300, example embodiments first define the I1, I2 and I3 ratios. For example, if we want coil 1, coil 2 and coil 3 to operate as one coil, and all currents flow in the same direction, then I1=I2=I3. Second, in this embodiment, coil 3 is tuned first based on ratio I2/I3 and the transmission line 310 with phase delay beta. Coil 3's impedance is tuned in such as way that I2/I3 ratio meets the requirement of Eq. 4 and Eq. 5. Third, coil 2 is tuned based on the ratio I2/I1 and the transmission line 210, which has a phase delay alpha. Note that the impedance seen by coil 2 at transmission line 310 is part of coil 2. This impedance is the transferred impedance of coil 3 by transmission line 310. Lastly, coil 1 is tuned to get the combined MRI RF coil array 300's frequency to the working frequency. Coil 1's impedance includes the impedance of coil 2 which is seen through transmission line 210. In this example, the intrinsic impedance of transmission lines 210 and 310 do not need to be the same as long as Eq. 4 and Eq. 5 are satisfied. This approach can be extended to more than three coils connected in series using the same principle.

Figure 4:
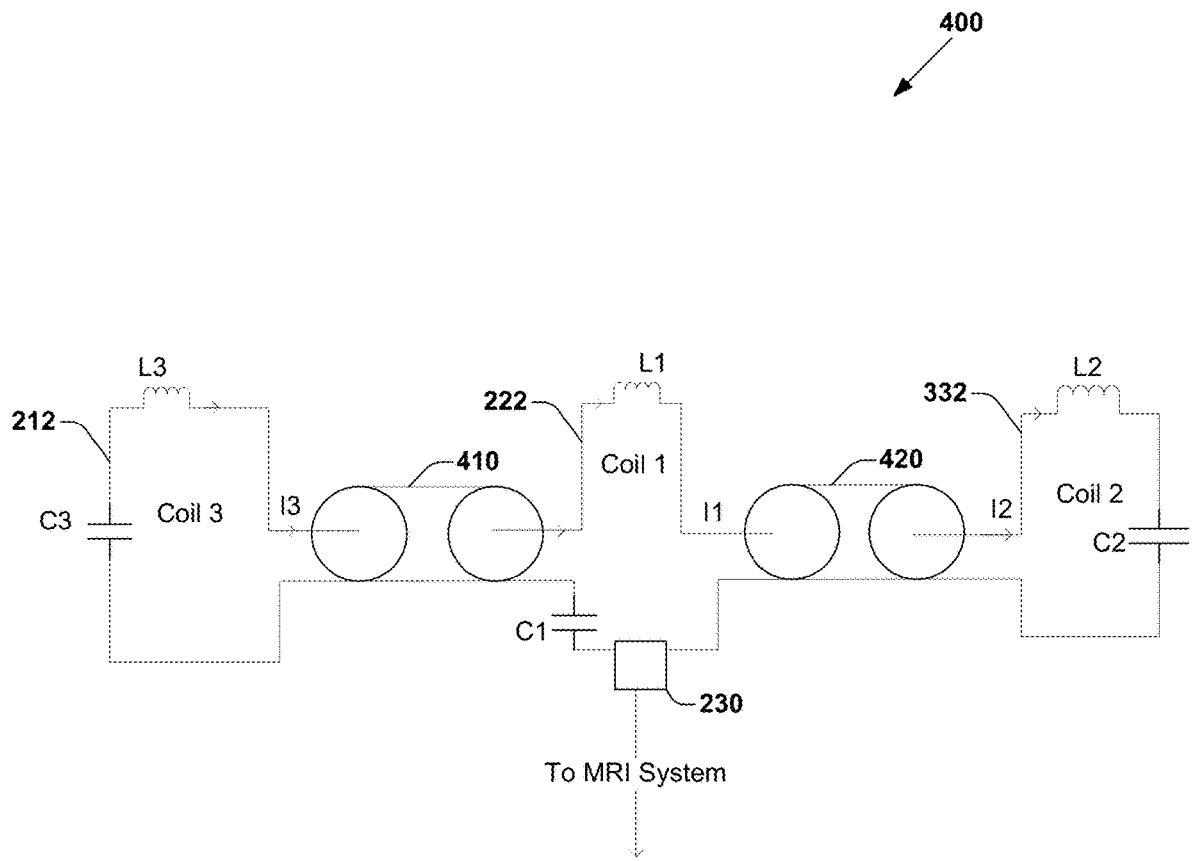
FIG. 4 illustrates MRI coil elements connected in a star topology.

Another way to expand the coil so that it includes a plurality of coil elements is to use a star topology. An exemplary star topology approach is illustrated in FIG. 4. FIG. 4 is a coil block diagram of a three-loop coil 400. Coil 1 is connected between coil 2 and coil 3. Coil 1 is electrically connected with coil 2 by transmission line 420. Coil 1 is electrically connected with coil 3 by transmission line 410. The tuning approach for a star topology coil (e.g., three-loop coil 400) is similar to that described with respect to FIG. 3, but in this situation, I2/I1 and I3/I1 are used as the ratios during the tuning process. Three-loop coil 400 is configured to operate as one combined coil.

Figure 5:
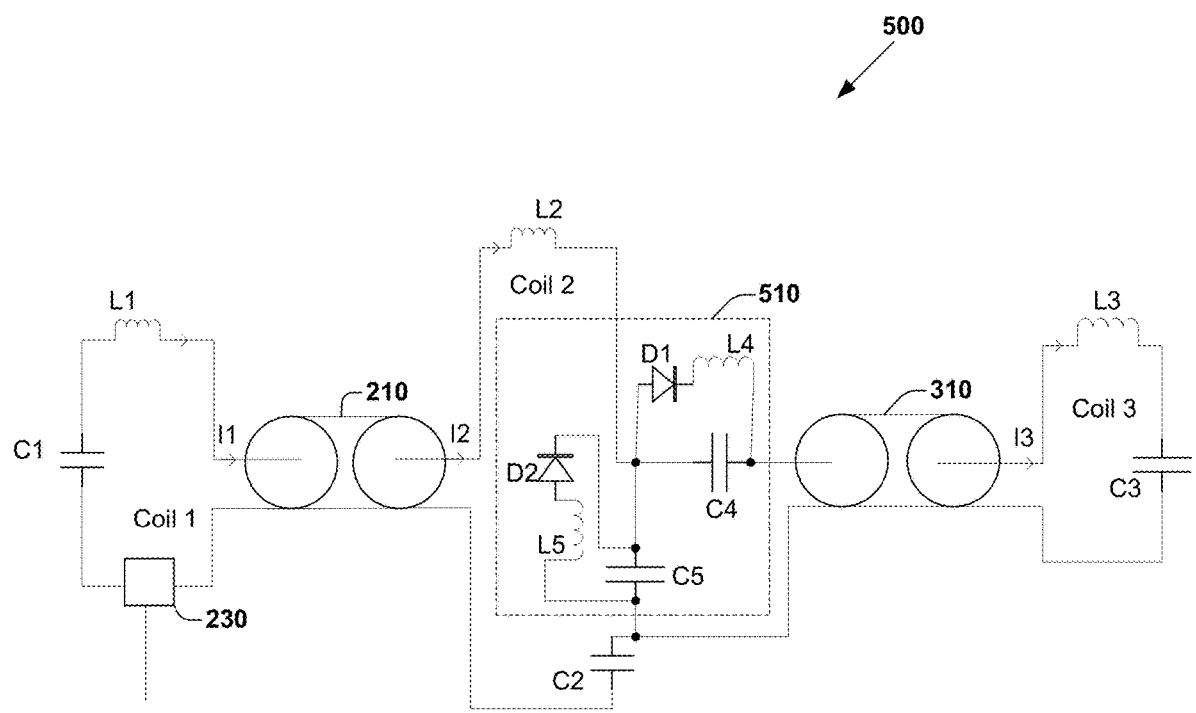
FIG. 5 illustrates MRI coil elements connected in series, including a switch circuit.

In some situations, it may be desirable to disable one of the coils in a coil array while still keeping other coils in the array working. For example, there are clinical imaging situations in which three coils (or rows of coils) cover different areas of a subject to be imaged (e.g., head, neck) and we want to turn off one of the three coils or rows of coils. Consider a head/neck coil that may have two functions. A first function may be to image the head area only, while a second function may be to image the head and neck area together. To realize this function in an in-series approach, a combined coil 500 may include a mode control circuit 510 as illustrated in FIG. 5. For example, consider a situation in which we want to disable coil 3 in FIG. 5. Compared to the embodiments illustrated in FIG. 3 or FIG. 4, coil 500 includes mode control circuit 510 which includes inductors L4, L5, capacitors C4, C5, and PIN diodes D1 and D2. Capacitor C4 is considered part of coil 2 when all three coils are operating as one combined coil. Inductor L4 and capacitor C4 are chosen to resonate at the working frequency if PIN diode D1 is ON (i.e., short). Similarly, inductor L5, and capacitor C5 are chosen to resonate at the working frequency if PIN diode D2 is ON (i.e., short). If we want to use coil 3, we may set D1 OFF (i.e., open) and D2 ON (i.e., short). Then inductor L5, capacitor C5, and PIN diode D2 create high impedance which means that they can be considered as not part of the combined coil. Then the combined coil is like that illustrated in FIG. 4 or FIG. 3 except in FIG. 5 we have a capacitor C4. If we do not want to use coil 3, then we set PIN diode D1 ON (i.e., short) and PIN diode D2 OFF (i.e., open), resulting in a high impedance across capacitor C4. Thus the transmission line 310 with phase delay beta and coil 3 are separated from the rest of the coil array.

Capacitor C5 may be chosen in such a way that its impedance equals the impedance of capacitor C4, transmission line 310, and coil 3 viewed from the left when coil 3 is used. Capacitor C5 then simulates the existence of capacitor C4, transmission line 310, and coil 3. In one embodiment, an inductor may be used instead of capacitor C5 to simulate the whole of capacitor C4, transmission line 310, and coil 3 for different current directions. Therefore, the resonance of the combined coil 500 remains unchanged. In one embodiment, the SNR or coil efficiency of coil 1 and coil 2 will be slightly better if coil 3 is not used because the beta phase delay coaxial cable 310's loss and coil 3's loss are removed from the coil 500. This may provide an additional performance improvement. The same technique can also be used to disable one or more of the coils in the star topology approach illustrated in FIG. 4. Note that coil 3 and transmission line 310 still form a resonant circuit when D1 is shorted and the L4 and C4 tank circuit isolates 310 and coil 3 from rest of the coil. The resonant frequency of coil 3 and transmission line 310 is different from the working frequency of the coil 500. Therefore, the coupling between 500 and coil 3 and transmission line 310 shall not create a coupling issue. However, if the resonant frequency of coil 3 and transmission line 310 is very close to coil 500's working frequency, additional PIN diode controlled decoupling circuitry in coil 3 may be employed to mitigate the coupling between the isolated coil 3 and transmission line 310 and coil 500.

Thus, a plurality of coils may be connected together as described herein so that they operate as one combined coil. Example embodiments extend this approach to applications in parallel imaging both in Tx and Rx mode to provide an acceleration factor using fewer channels than existing approaches. Consider an example existing 4-channel coil having four loops or coil elements. This example 4-channel coil can be used for Rx or pTx applications. This coil is illustrated in FIG. 6a and FIG. 6b.

Figure 6A:
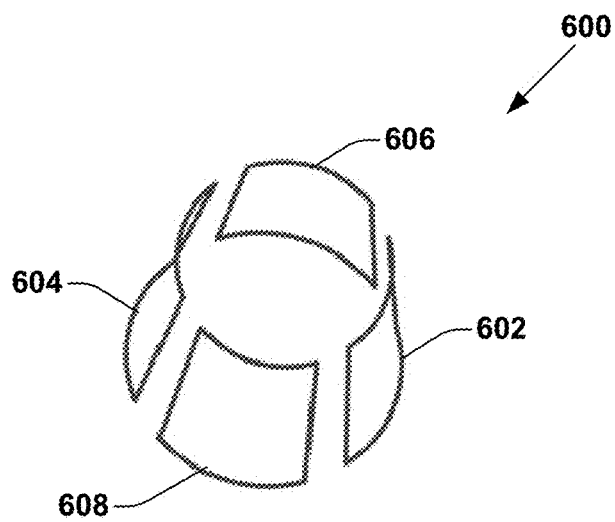
FIG. 6A illustrates a four-channel MRI coil.
Figure 6B:
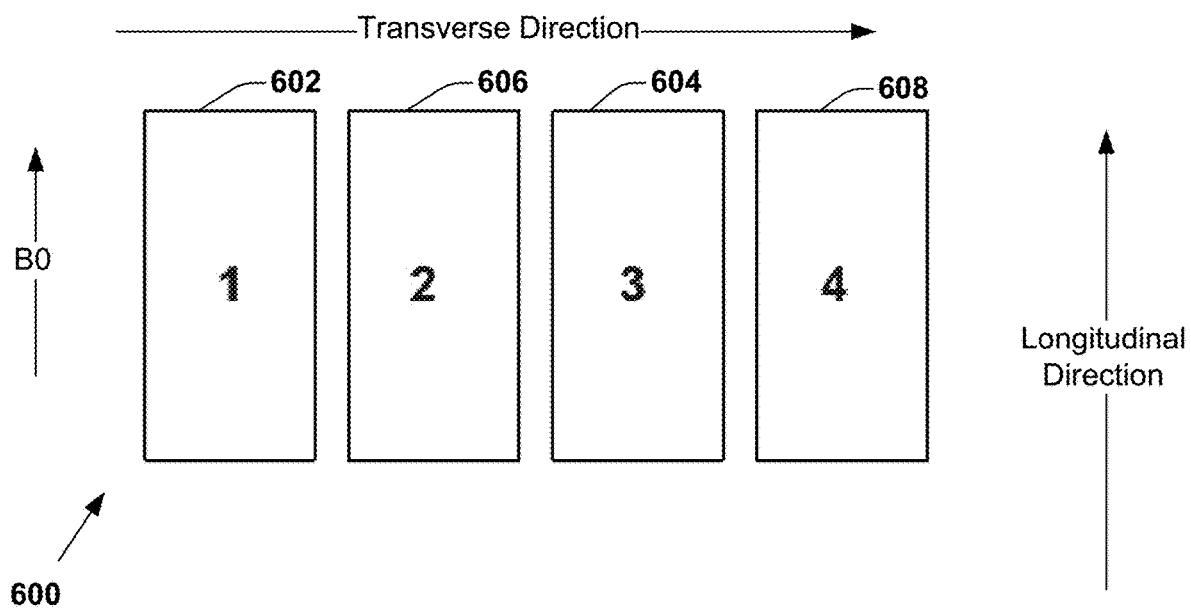
FIG. 6B illustrates a four channel MRI coil.

FIG. 6a is a perspective drawing of a 4-channel (4 loop) coil 600 configured according to existing approaches in a cylindrical shape. The same 4-channel (4 loop) coil 600 is illustrated in FIG. 6b in a simplified flat view for clarity of illustration. FIGS. 6A and 6B illustrate a gap between adjacent loops. In embodiments described or illustrated herein, while adjacent loops may be illustrated with gaps for clarity of illustration, the adjacent loops may be overlapped to achieve optimum decoupling (i.e., isolation). The gap illustrated here is only for ease of illustration. Note that in FIG. 6B, loops 602-608 are marked with corresponding channel numbers 1-4. Channel numbers 1-4 are for explanatory purposes only.

Loop 602 and loop 604 of FIG. 6 have very strong mutual coupling because they face each other (i.e., are disposed 180 degrees from each other on the cylinder), as illustrated in FIG. 6A. Similarly, loop 606 and loop 608 have very strong coupling because they also face each other. This coupling creates a difficulty for both Rx coils and pTx coils. When operating in Rx mode, the strong coupling decreases coil SNR performance even when a low input impedance preamplifier decoupling technique is used. When operating in Tx mode, the strong coupling allows strong power transfer between different channels which makes RF power control for each channel very difficult. This coupling can be mitigated by using transformer decoupling, capacitor decoupling, or a capacitor network approach. A capacitor network approach uses shared rings among the channels with adjustable capacitors used for isolation improvement. One capacitor network decoupling approach is described in United States Patent Publication Number US20020169347A1. For parallel imaging, 4-channel coil 600 can provide MRI scan acceleration at a factor of two in the transverse plane because there are at least two uniquely different coil sensitivity profiles in any direction of the transverse plane. For example, for left to right or from anterior to posterior, we can at least see loops 604 and 606 or 602 and 606 in those directions. However, there is no acceleration in the longitudinal direction because there is only one unique coil channel, i.e., one row only, in that direction. For example, we can see only channel 1 regarding the local channel sensitivity profile, or channel 2 only, and so on, in the longitudinal direction. Embodiments described herein improve on existing coils such as coil 600 using the techniques described earlier with respect to FIGS. 2-5, by using a transmission line to connect two or more coils together as one, facilitating a four-channel coil as illustrated in FIG. 7A and FIG. 7B.

Figure 7A:
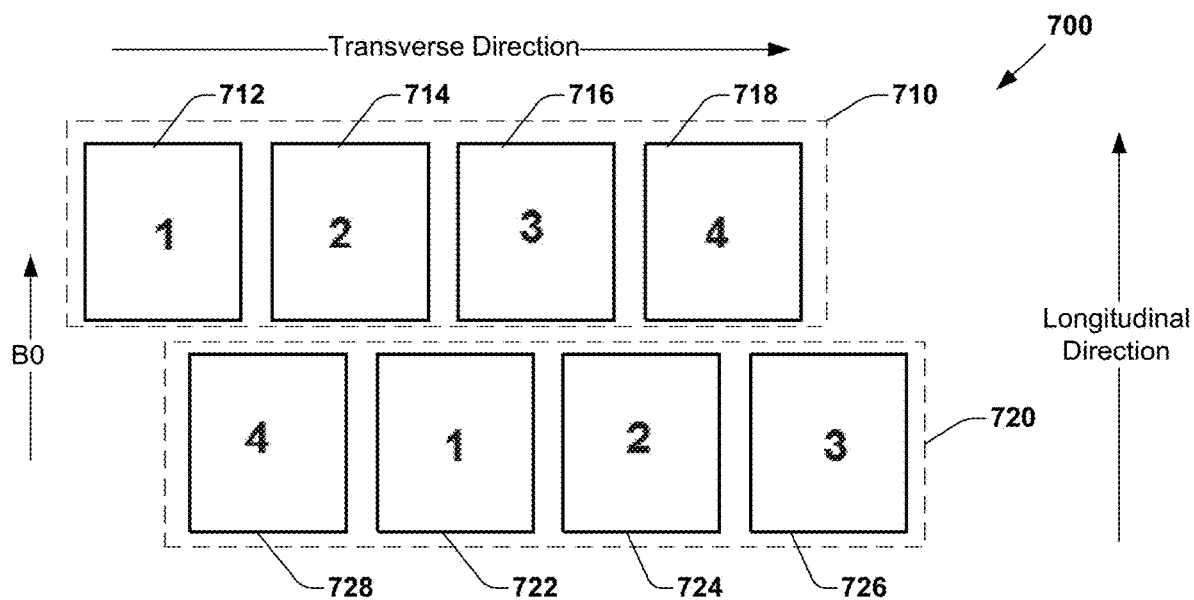
FIG. 7A illustrates an eight-loop, four-channel MRI coil.

FIG. 7A is a simplified diagram of an exemplary MRI RF coil array 700. MRI RF coil array 700 in this example is a cylindrical MRI RF coil array. FIG. 7A illustrates the elements of MRI RF coil array 700 flatly, similar to FIG. 6B, for clarity of illustration. MRI RF coil array 700 includes eight coil elements or loops 712, 714, 716, 718, 722, 724, 726, and 728. Loops 712-728 may be loop coils, saddle coils, or other type of LC circuit configured for use as an MRI Rx, Tx, or Rx/Tx loop. Loops 712-718 are arranged in a first row 710. Loops 722-728 are arranged in a second row 720. Members of loops 712, 714, 716, 718, 722, 724, 726, and 728 may be described as pairs of loops in which each pair is indicated by one channel number, e.g., 1, 2, 3, or 4 for ease of illustration. For example, loop 712 and loop 722 are both indicated with channel number 1, and thus comprise a first pair. Similarly, loop 714 and loop 724 are indicated with channel number 2, and comprise a second, different pair. Loop 716 and loop 726 are both indicated with channel number 3 and comprise a third, different pair. Loop 718 and loop 728 are indicated with channel number 4 and comprise a fourth, different pair. Loops that comprise a pair are electrically connected with each other to form a combined coil. For example, loop 712 and loop 722 are electrically connected with each other according to techniques described herein, including techniques described with respect to FIGS. 2-5. Thus, MRI RF coil array 700 is a four-channel array. Note that the column position for loops associated with a particular channel is different for each loop associated with that channel. For instance, for channel one, the column position for loop 712 in the first row 710 is [1,1] (using matrix notation) while the column position for loop 722 in the second row 720 is [2,2]. In embodiments described herein, loops or coil elements associated with the same channel (i.e., loops or coil elements comprising a combined coil) have different column positions.

Figure 7B:
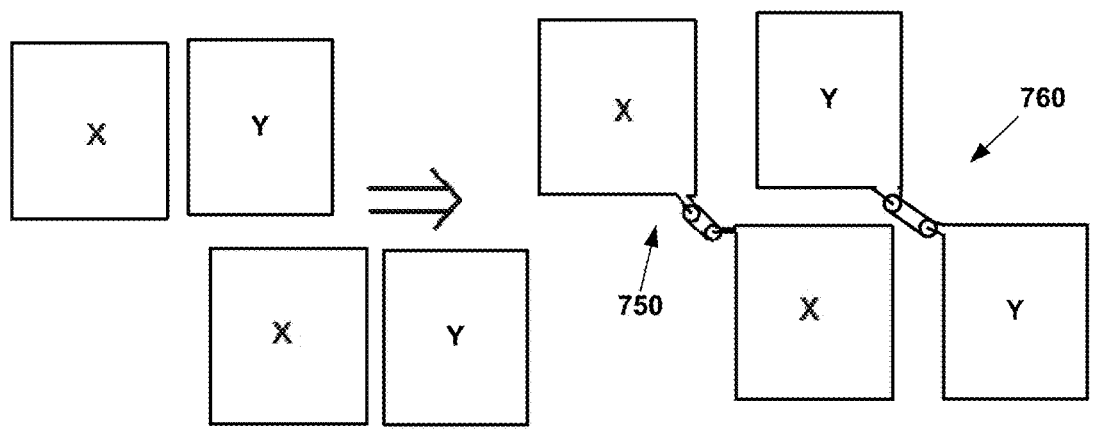
FIG. 7B illustrates connected MRI coil elements.

FIG. 7B illustrates how pairs of coils indicated with the same channel number, i.e., the members of the pair indicated with same channel number (represented by x, or y in this example) are electrically connected with each other by transmission lines which control the elements of the pair to operate as one combined coil according to embodiments described herein. In FIG. 7B, loops marked "X" are connected as a first pair 750, and loops marked "Y" are connected as a second pair 760. Returning to FIG. 7(a), following this example, loop 712 and loop 722 are connected with a transmission line according to the techniques described with respect to FIGS. 2-5. Loops 714 and 724, 716 and 726, and 718 and 728 may be similarly connected. While MRI RF coil array 700 includes two rows, it is to be appreciated that embodiments described herein may include other, different numbers of rows, and that coil elements combined to operate as one combined element are not limited to pairs, but may include triples of coil elements, or other numbers of coil elements configured to operate as one combined coil.

The embodiment of MRI RF coil array 700 illustrated in FIG. 7A has several advantages compared to existing coils. The first is that each coil element (e.g., loops 712, 714, 716, 718, 722, 724, 726, and 728) can be decoupled from all the other coil elements using simple decoupling techniques, such as coil overlap. Furthermore, coils that are electrically connected to operate as one combined coil may be easily decoupled from the other coils connected to operate as other, combined coils, where a combined coil corresponds to a channel. For example, channel 1 in FIG. 7A (loops 712, 722) has channels 2, 3, and 4 as direct neighbors. Contrast this with the situation illustrated in FIG. 6 by MRI RF coil array 600, in which channel 1 in only has channels 2 and 4 as direct neighbors. To decouple channel 1 and channel 3 in the existing approach illustrated in FIGS. 6A and 6B other, more complicated and expensive decoupling techniques, such as capacitor decoupling or transformer decoupling, must be used. This may be doable for a 4-channel coil but may not be realistic for an eight or 16-channel coil because there are too many channels. A second advantage is that MRI RF coil array 700 not only provides acceleration of a factor of two in the transverse direction but also in the longitudinal direction because slices along the longitudinal direction always have two localized $B_1$ field patterns while the existing 4-channel coil 600 illustrated in FIGS. 6A and 6B does not have this acceleration. A third advantage is lower cost compared to existing MRI RF coil arrays with similar numbers of elements. In a MRI RF coil array configured using existing approaches, the acceleration in the transverse plane and the longitudinal direction achieved by MRI RF coil array 700 would require 8 channels. Embodiments described herein only need 4 channels. Thus, MRI RF coil array 700 uses 50% less channels than a conventional approach, i.e., example embodiments using 4-channels can do the equivalent job of an existing coil approach that uses 8-channels regarding acceleration. Using fewer channels to do the equivalent job (e.g., 4 channels instead of 8 channels) reduces the complexity of the coil, reduces manufacturing complexity, reduces the complexity of decoupling coil elements from each other, facilitates the use of less complicated MRI systems, and reduces cost compared to existing approaches. Such improvements may further lead to improved patient outcomes.

Figure 8A:
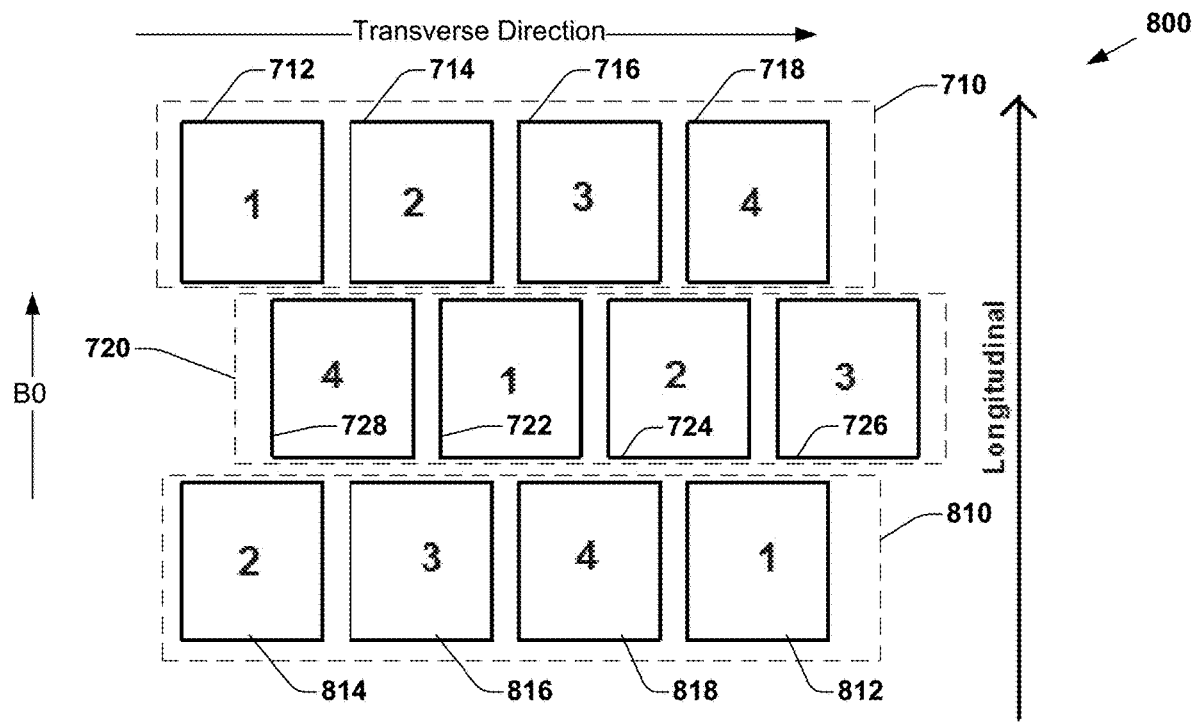
FIG. 8A illustrates a twelve-loop, four-channel MRI coil.

FIG. 8A illustrates an example embodiment of a 4-channel MRI RF coil array 800. MRI RF coil array 800 is similar to MRI RF coil array 700 but includes an additional row 810. Row 810 includes four loops 812-818. Loops 812-818 may be loop coils, saddle coils, or other type of LC circuit configured for use as an MRI Rx, Tx, or Rx/Tx loop. Thus MRI RF coil array 800 includes a total of twelve coil elements or loops. Note that in row 810, the ordering of the coil elements (e.g., loops) is arranged such that pairs of facing loops contribute to a variety of combinations of facing loops, such that for each column its 180 degree-facing opposite column contains as many different channels as possible, given the number of rows and columns and channels. MRI RF coil 800 provides acceleration factors of two in the transverse direction and three in the longitudinal direction. In this configuration each combined coil corresponding with each channel (e.g., channel 1, 2, 3, or 4) decouples from all other channels with an acceleration of up to a factor of three in the longitudinal direction. Thus 4-channel MRI RF coil array 800 using approaches described herein can do achieve a conventional 12-channel coil's performance using just four channels regarding acceleration.

Figure 8B:
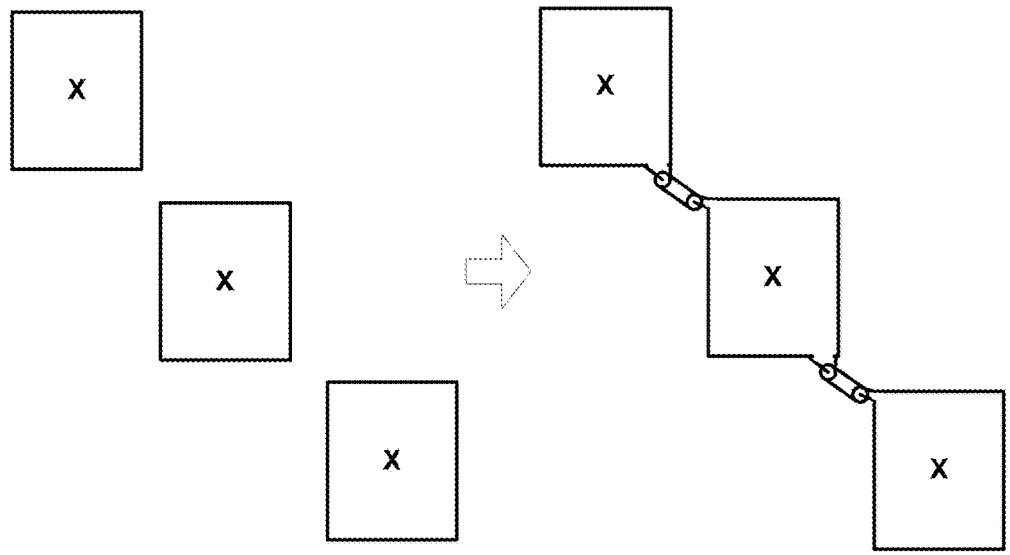
FIG. 8B illustrates connected MRI coil elements.

FIG. 8B illustrates a set of coils indicated with the same channel number, where the members of the set indicated with same channel number (represented by x in this example) are electrically connected with each other by transmission lines which control the elements of the set of coils (e.g., triple) to operate as one coil according to techniques described herein. In FIG. 8*b*, loops marked "X" are connected as a first set. Thus in FIG. 8A, following this example, loop 712, loop 722, and loop 812 are connected with a transmission line according to the techniques described with respect to FIGS. 2-5. Similarly, loop 714, loop 724, and loop 814 (i.e., a second channel) are connected with a transmission line according to the techniques described with respect to FIGS. 2-5. This approach extends to channel 3 (loops 716, 726, 816) and channel 4 (loops 718, 728, 818). In one embodiment, a set of coils configured as a channel are connected in series. For example, loops 712, 722, and 812 may be connected in series as channel 1. In another embodiment, a set of coils configured as one combined coil associated with one channel are connected according to a star topology. Electrically connecting elements to operate as a combined coil may include tuning the elements according to tuning approaches and methods described herein, for example as described with respect to FIG. 2 or FIG. 3.

Figure 9:
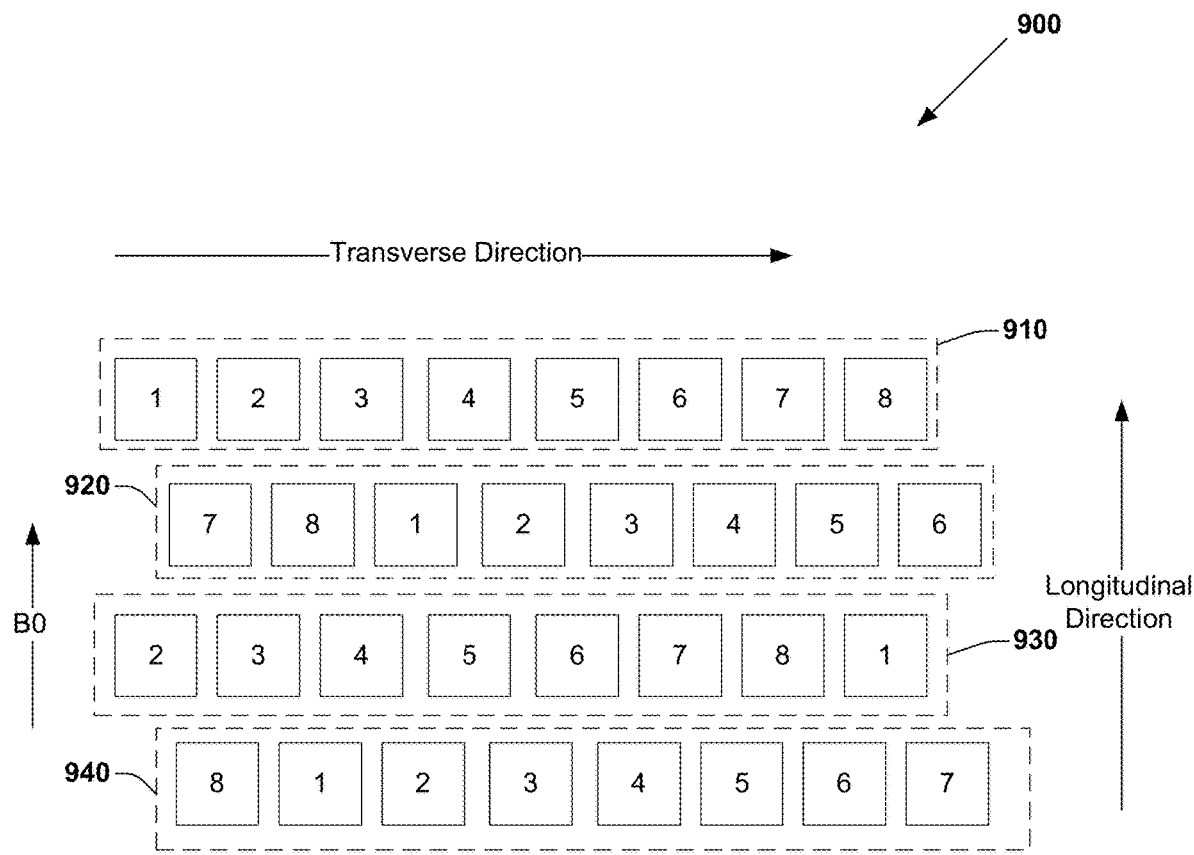
FIG. 9 illustrates a 32-loop, eight-channel MRI coil.

The embodiments described with respect to four-channel, two-row, and four column MRI RF coil array 700, or four-channel, three-row, and four-column MRI RF coil array 800 may be extended to MRI RF coil arrays that include other, different numbers of rows, columns, or coil array elements. For example, FIG. 9 illustrates an 8-channel MRI RF coil array 900 comprising four rows of eight elements each, resulting in a four row, eight column array which can provide 4× acceleration in the transverse direction and 4× acceleration in the longitudinal direction. MRI RF coil array 900 includes four rows 910, 920, 930, and 940. Each row 910-940 includes eight elements, resulting in eight columns of coil elements or loops. Columns are aligned with the $B_0$ direction. In FIG. 9, individual elements, loops, or coils having the same channel number (e.g., coils illustrated with channel number 1) in different rows are electrically connected according to techniques described with respect to FIGS. 2-5, and are configured to operate as one combined coil. For example, all the elements illustrated with a channel number "1" are electrically connected with each other to operate as a first combined coil, which may be connected to a respective first channel of a multiple channel MRI system. All the elements illustrated with a channel number "2" are electrically connected with each other to operate as a second combined coil. This approach extends to elements with channel numbers "3" through "8". Electrically connecting elements to operate as a combined coil may include tuning the elements according to tuning approaches and methods described herein, for example as described with respect to FIG. 2 or FIG. 3.

In this example, for each row 910-940 there are 8 uniquely different channels, such as channel 1, channel 2, channel 3, channel 4, channel 5, channel 6, channel 7, and channel 8. For a slice in the longitudinal direction, i.e., column, consider one example. If we have one slice through the channels associated with the first column, (e.g., 1, 7, 2 and 8), then the other side of the slice is though channels 5, 3, 6 and 4. This slice still has 8 unique channels. As a result the acceleration in the longitudinal direction may be up to 4× acceleration without incurring significant acceleration artifacts. Thus, embodiments as described with respect to FIG. 9, including MRI RF coil array 900, provide an 8-channel MRI RF coil array 900 that can do a conventional 32-channel array's job, and in which all combined coils are decoupled from each other. Recall that we need to decouple 32*31/2=496 pairs for existing 32 channel coils, which is a significant problem in a clinical setting as well as in manufacturing and design. Embodiments reduce the decoupling problem to, in the example illustrated in FIG. 9, decoupling 8*7/2=28 pairs using overlap-based decoupling while providing similar functionality. Example embodiments facilitate using multi-channel coils and performing decoupling by using overlap decoupling techniques. Thus, embodiments provide a significant reduction in decoupling complexity, while maintaining or increasing image quality, compared to existing approaches. In other embodiments, other decoupling techniques may be employed. While four rows of eight elements are described in this example, embodiments are not limited to four rows of eight elements, but may include other numbers of rows and elements.

Recall that cylindrically shaped MRI RF coil arrays, for example MRI RF coil arrays 700-900, have columns that face each other. For example, a column will face the column located at 180 degrees from itself on the cylinder. Thus, in a four column array such as MRI RF coil array 700 or 800, the first column will face the third column, while the second column will face the fourth column. Embodiments maximize the number of different channels in facing columns. Embodiments avoid repeated channels in rows or columns. Increasing the difference in facing channels increases the acceleration that the MRI RF coil array can achieve.

In embodiments described herein, for limited row and column numbers where each row has the same number of channels, such as eight or less, which can cover most high channel count applications, the following exemplary approach may be used to determine the channel layout. In one embodiment, first we layout the first row. The first row may include a consecutively continuous channel distribution along the whole circumference if the former is an enclosed cylindrical-shaped or substantially cylindrical former. Second we layout the second row. The second row may be arranged using a column shift of the first row. The number of the column shift shall be determined based on the number of channels. For example, for an eight channel coil each channel in one row has two neighboring channels that we can use overlap to isolate. We also know that each channel has seven neighbors that need to be isolated. Therefore, we still need five (i.e., 7−2=5) more overlaps to isolate each channel. If we add the second row and shift the column in such a way that each channel sees two more different channels, then we acquire two more isolations and only three more isolations are required. For example, in FIG. 9, channel 3 in row 910 is isolated from channel 2 and channel 4 in row 910 by overlap. The $2^{nd}$ row 920 is shifted one and a half columns to the right. As a result the channel 3 in row 910 sees two new direct neighbors, i.e., channel 8 and channel 1 in row 910. Third, we may create two more direct neighbors by shifting columns in row 3 930 as well as row 4 940. In principle we can create eight direct neighbors in FIG. 9. However, we only need seven direct neighbors in the example illustrated in FIG. 9. This means that we may have many different possible layouts to achieve the same functions. The layout illustrated in FIG. 9 is just one of the possible solutions. The same method described herein can also be used if the channel numbers are different between rows. In summary, embodiments use different rows to create new unique direct neighbors for easy isolation until we isolate all channels. The more rows we have, the more solutions there are to isolate all channels.

The embodiments of MRI RF coil arrays 700-900 described above describe multi-channel MRI RF coil arrays configured in a cylindrical shape. Embodiments described herein may be configured as coils or MRI RF coil arrays configured in other shapes. For example, embodiments may be configured in a substantially cylindrical shape in which a first opening at a first end has a different diameter than a second opening at a second end (i.e., a truncated cone shape). The relationship of the diameter of the opening at the first end with the diameter of the opening at the second end may be based on a ratio. For example, embodiments may have a first end opening/second end opening ratio of 1/0.9, 1/0.75, or other ratio. The ratio may be based on, for example, a type of anatomy for which the MRI RF coil array is configured to image. Example embodiments may be configured in a flat shape. Applications for flat coil arrays include a spine coil, a cardiac coil, and a torso coil.

Figure 10:
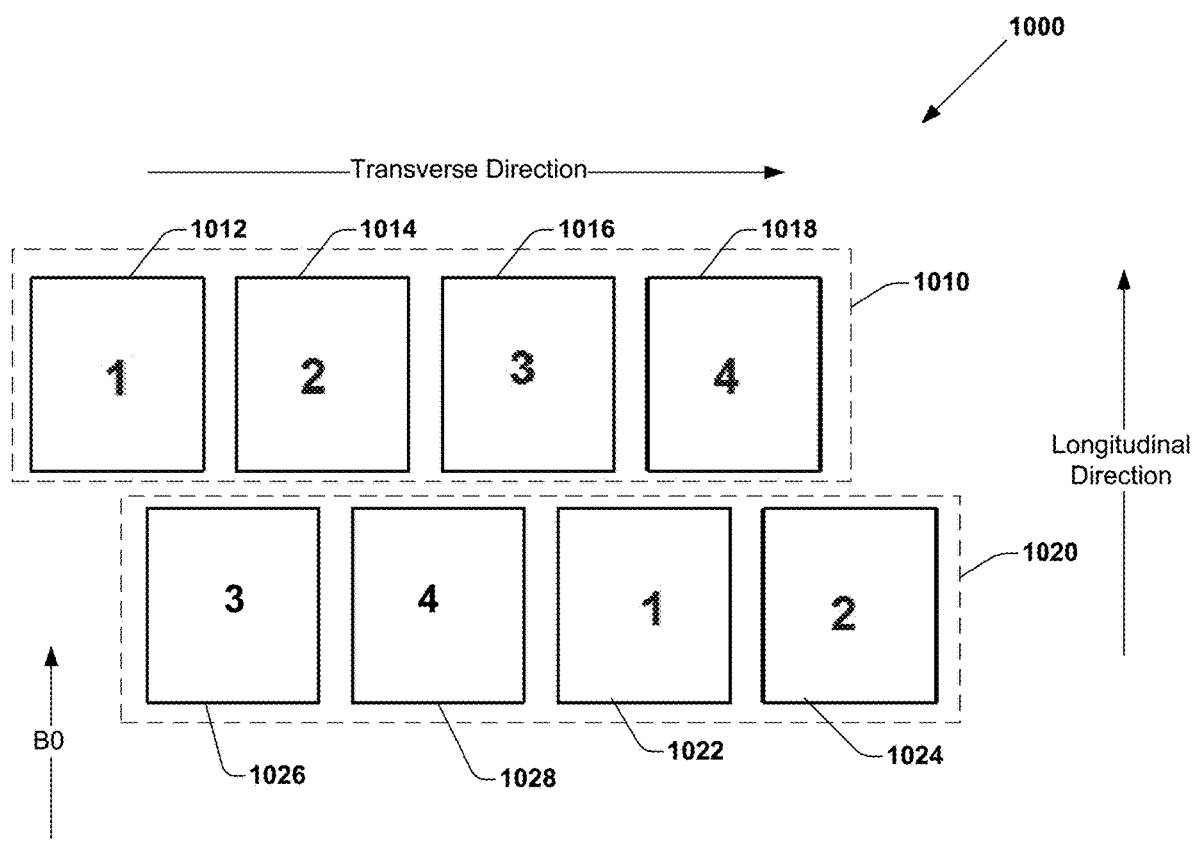
FIG. 10 illustrates a four-channel, flat surface MRI coil.

FIG. 10 illustrates a 4-channel MRI RF coil array 1000 configured for use on a flat surface. MRI RF coil array 1000 may be used as a spine coil, a cardiac coil, a torso coil, or for other MRI imaging applications that require a flat shape. MRI RF coil array 1000 includes a first row 1010 and a second row 1020. First row 1010 includes four loops 1012-1018. Second row 1020 includes four loops 1022-1028. Loops 1012-1028 may be loop coils, saddle coils, or other type of LC circuit configured for use as an MRI Rx, Tx, or Rx/Tx loop. In this embodiment, loop 1012 and loop 1022 are electrically connected to operate as a first combined coil. Loop 1014 and loop 1024 are electrically connected to operate as a second combined coil. Loop 1016 and loop 1026 are electrically connected to operate as a third combined coil. Loop 1018 and loop 1028 are electrically connected to operate as a fourth combined coil. In FIG. 10, individual elements, loops, or coils having the same channel number (e.g., coils illustrated with channel number 1) in different rows are electrically connected according to techniques described with respect to FIGS. 2-5, and are configured to operate as a combined coil.

Note that the arrangement of loops in row 1020 differs from the arrangement of loops in row 720 of MRI RF coil array 700, because 4-channel MRI RF coil array 1000 is configured as a flat array, and thus does not have 180 degree facing columns that cylindrical arrays experience. A difference between flat and cylindrical shaped embodiments is the arrangement of channels at the two ends of each row. The two end channels of each row in a flat coil only have one direct neighbor in the row while all channels of each row in cylindrical shaped coils have two channels as direct neighbors. MRI RF coil array 1000 provides 4× acceleration in the transverse direction and 2× acceleration in the longitudinal direction. In this embodiment, each of the combined coils associated with channels 1, 2, 3, and 4 decouple from each other.

Embodiments described herein can further be used in a coil array configured with mode selection without increasing the number of coil channels by using the mode selection approach described with respect to FIG. 5. Mode selection applications are used in imaging particular anatomies, such as the head and spine. For head imaging applications a coil may have a full head mode and a smaller brain mode which splits the coil in the superior-inferior direction into two sections. Using the mode selection approach illustrated in FIG. 5 and mode control circuit 510, embodiments provide a coil which can support both head mode and brain mode using the same number of channels. In clinical situations, the brain mode may have a better performance than the head mode when imaging the brain compared to existing approaches.

Figure 11A:
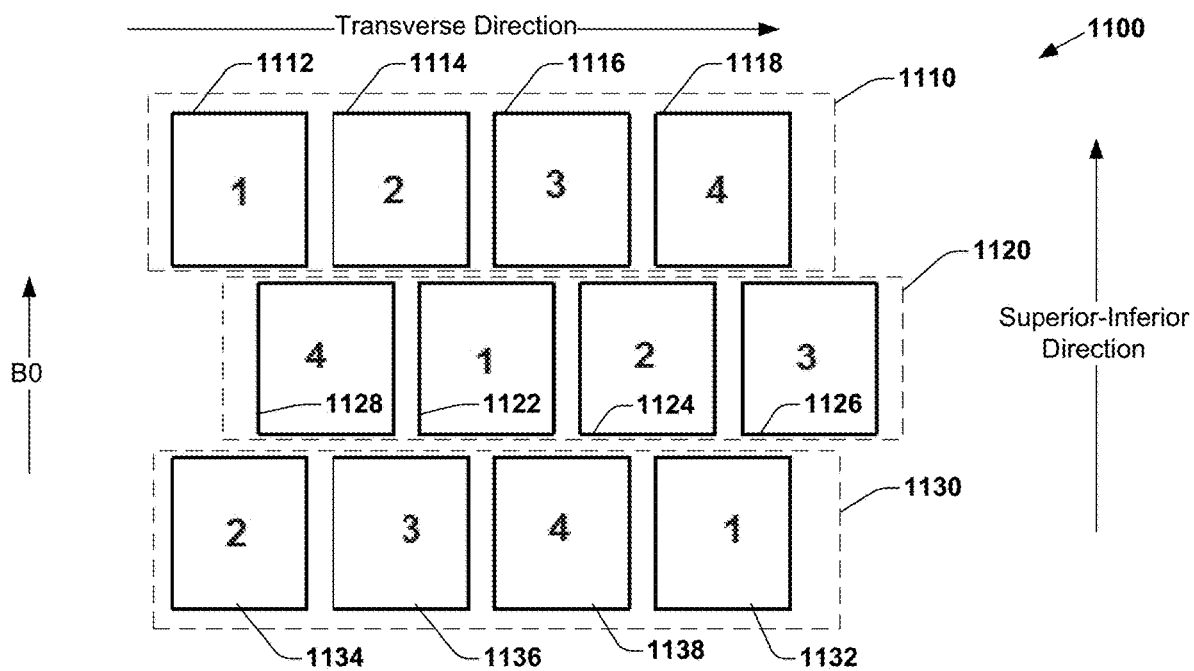
FIG. 11A illustrates a four-channel head coil with an improved brain mode.
Figure 11B:
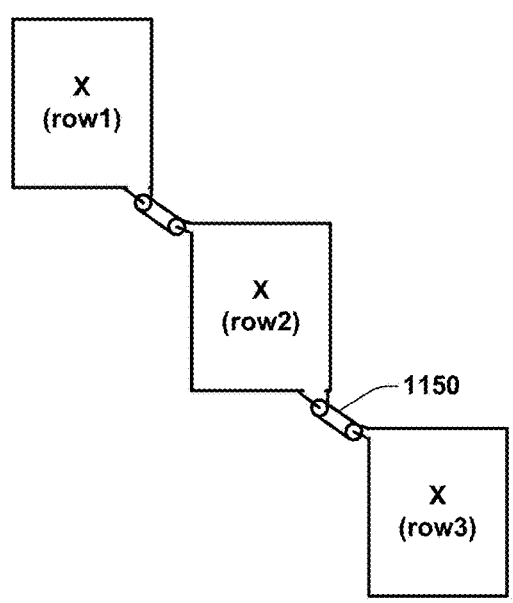
FIG. 11B illustrates connected MRI coil elements.

FIGS. 11A and 11B illustrates a 4-channel MRI RF coil array 1100 configured as a head coil having a head mode and an improved brain mode. MRI RF coil array 1100 has three rows 1110, 1120, and 1130, where each row includes four loops. Row 1110 includes loops 1112-1118. Row 1120 includes loops 1122-1128. Row 1130 includes loops 1132-1138. In this embodiment, row 1110 and row 1120 cover the brain area. Row 1130 covers the lower head/neck area. MRI RF coil array 1100 is configured similarly to MRI RF coil array 800, but includes additional details and elements. In this embodiment, mode selection circuitry as described with respect to FIG. 5 with mode control circuit 510 is included between row 1120 and row 1130. FIG. 11b illustrates mode selection circuitry 1150 disposed between elements of row 1120 and row 1130. In one example, mode selection circuitry 1150 is controlled to disable loops in row 1130 when MRI RF coil array 1100 operates in brain mode, and mode selection circuitry 1150 is controlled to enable loops in row 1130 when MRI RF coil array 1100 operates in full-head mode. Mode selection circuitry 1150 may be connected to an MRI system that provides a DC bias current to control PIN diodes that comprise, in part, mode selection circuitry 1150. Disabling row 1130 while operating in brain mode may provide an improved SNR compared to when all three rows 1110-1130 are enabled when operating in head mode. Thus, 4-channel MRI RF coil array 1100 can do the job of a conventional 12-channel coil while providing for the selection of two modes (i.e., head mode, brain mode). This approach may be extended to other multiple mode applications, such as imaging the spine. In one embodiment, a spine coil has three modes: cervical, thoracic, and lumbar. In this example, a cervical mode may include selecting only a first group of rows. A thoracic mode may include selecting only a second, different group of rows. A lumbar mode may include selecting only a third, different group of rows. Other combinations of selected rows may be employed. While a four-channel, three-row, four-column MRI RF coil array is illustrated in FIG. 11a, embodiments are not limited to four channel, three row, four column configurations. For example, the approach described with respect to MRI RF coil array 1100 may be extended to MRI RF coil arrays with other, different numbers of elements, rows, or columns.

In one example embodiment of a four-channel MRI RF coil array, an MRI RF coil array for use in an MRI system is configured to operate in a parallel transmit (pTx) mode or a parallel receive (Rx) mode. FIG. 7A illustrates an exemplary MRI RF coil array 700 configured according to this embodiment. The MRI system produces a $B_0$ field. The MRI RF coil array includes a plurality of coil elements configured for transmitting or receiving RF signals. The plurality of coil elements is arranged in two rows, where a first row includes four coil elements, and where a second, different row includes four different coil elements. Thus the plurality of coil elements are further arranged in four columns, (i.e., as a 2 by 4 array). The four columns are aligned with the $B_0$ field of the MRI system. A first coil element of the first row is electrically connected to a second coil element of the second row. The first coil element of the first row and the second coil element of the second row are configured operate as a first combined coil configured to connect to a corresponding first Rx channel, or a corresponding first Tx/Rx channel for pTx of the MRI system. A second coil element of the first row is electrically connected to a third coil element of the second row. The second coil element of the first row and the third coil element of the second row are configured to operate as a second combined coil configured to connect to a corresponding second Rx channel or corresponding second Tx/R channel for pTx of the MRI system. A third coil element of the first row is electrically connected to a fourth coil element of the second row. The third coil element of the first row and the fourth coil element of the second row are configured to operate as a third combined coil configured to connect to a corresponding third Rx channel or corresponding third Tx/Rx channel for pTx of the MRI system. A fourth coil element of the first row is electrically connected to a first coil element of the second row. The fourth coil element of the first row and the first coil element of the second row are configured to operate as a fourth combined coil configured to connect to a corresponding fourth Rx channel or corresponding fourth Tx/Rx channel for pTx of the MRI system. The first combined coil, the second combined coil, the third combined coil, and the fourth combined coil are electromagnetically decoupled from each other. Coil elements may be electrically connected according to techniques described with respect to FIGS. 2-5.

In one embodiment, the first combined coil, the second combined coil, the third combined coil, and the fourth combined coil are electromagnetically decoupled from each other using an overlap decoupling approach. For example, individual coil elements may overlap each other to facilitate minimizing electromagnetic coupling. In another embodiment, other decoupling techniques may be employed.

In one embodiment, the MRI RF coil array is a single layer MRI RF coil array.

In one embodiment, the MRI RF coil array is configured in a substantially cylindrical shape, where the columns are aligned with the $B_0$ field of the MRI system. In another embodiment, the MRI RF coil array is configured in a flat shape, where the columns are aligned with the $B_0$ field of the MRI system.

Another example embodiment includes a four-channel, three-row, four-column MRI RF coil array for use in an MRI system, configured to operate in a pTx mode or an Rx mode. FIG. 8A illustrates an exemplary MRI RF coil array 800 configured according to this embodiment. The MRI system generates a $B_0$ field. In this embodiment, the MRI RF coil array includes a plurality of coil elements configured for transmitting or receiving RF signals arranged in three rows, where each row includes four coil elements. The members of the plurality of coil elements are thus further arranged in four columns. The four columns are aligned with the $B_0$ field of the MRI system. In this embodiment, a first coil element of the first row is electrically connected to a second coil element of the second row, and the second coil element of the second row is electrically connected to a fourth coil element of the third row. The first coil element of the first row, the second coil element of the second row, and the fourth coil element of the fourth row are configured operate as a first combined coil configured to connect to a corresponding first Rx channel of the MRI system. A second coil element of the first row is electrically connected to a third coil element of the second row, and the third coil element of the second row is electrically connected to a first coil element of the third row. The second coil element of the first row, the third coil element of the second row, and the first coil element of the third row are configured operate as a second combined coil configured to connect to a corresponding second Rx channel of the MRI system. A third coil element of the first row is electrically connected to a fourth coil element of the second row, and the fourth coil element of the second row is electrically connected with a second coil element of the third row. The third coil element of the first row, the fourth coil element of the second row, and the second coil element of the third row are configured operate as a third combined coil configured to connect to a corresponding third Rx channel of the MRI system. A fourth coil element of the first row is electrically connected to a first coil element of the second row, and the first coil element of the second row is electrically connected with a third coil element of the third row. The fourth coil element of the first row, the first coil element of the second row, and the third coil element of the third row are configured operate as a fourth combined coil configured to connect to a corresponding fourth Rx channel of the MRI system. In this embodiment, the first combined coil, the second combined coil, the third combined coil, and the fourth combined coil are electromagnetically decoupled from each other. Coil elements may be electrically connected according to techniques described with respect to FIGS. 2-5.

In one embodiment, the first combined coil, the second combined coil, the third combined coil, and the fourth combined coil are electromagnetically decoupled from each other using an overlap decoupling approach. In another embodiment, other decoupling techniques may be employed.

In one embodiment, coil elements comprising combined coils are connected in series according to techniques described herein. In this embodiment, the coil elements comprising the first combined coil are connected in series, the coil elements comprising the second combined coil are connected in series, the coil elements comprising the third combined coil are connected in series, and the coil elements comprising the fourth combined coil are connected in series. FIG. 3 illustrates an exemplary technique according to which coil elements comprising combined coils may be connected in series.

In one embodiment, coil elements comprising combined coils are connected in a star topology according to techniques described herein. In this embodiment, the coil elements comprising the second combined coil are connected in a star topology, the coil elements comprising the third combined coil are connected in a star topology, and the coil elements comprising the fourth combined coil are connected in a star topology. FIG. 4 illustrates an exemplary technique according to which coil elements comprising combined coils may be connected according to a star topology.

In one embodiment, the MRI RF coil array is configured in a cylindrical shape or in a substantially cylindrical shape. In this embodiment, the columns are aligned with the $B_0$ field of the MRI system. In another embodiment, the MRI RF coil array is configured in a flat shape, where the columns are aligned with a $B_0$ field of the MRI system.

In one embodiment, the MRI RF coil array is a single layer MRI RF coil array.

Another example embodiment includes an MRI RF coil array for use in an MRI system. The MRI system has a plurality of Rx channels. The MRI system produces a $B_0$ field. The MRI RF coil array is configured to operate in a pTx mode or a receive Rx mode in an MRI system. FIG. 9 illustrates an exemplary MRI RF coil array 900 configured according to this embodiment. The MRI RF coil array includes a plurality of coil elements configured for transmitting or receiving RF signals. The coil elements are arranged in a M by N array, where M represents the number of rows in the array, and N represents the number of columns in the array. In a preferred embodiment, N is greater than or equal to M, where both M and N are greater than one. The number of columns corresponds with the number of Rx channels in the MRI system. In this embodiment, columns are aligned with the $B_0$ field.

In this embodiment, members of the plurality of coil elements are configured as a plurality of combined coils. The number of combined coils in the plurality of combined coils corresponds with the number of columns. A combined coil comprises a coil element in a first row of the M by N array that is electrically connected with a coil element in each of the remaining rows. Thus, in a four-row embodiment, for example, a coil element in row m1 is connected with a coil element in row m2, which is connected with a coil element in row m3, which is in turn connected with a coil element in row m4. The column position of each coil element of the combined coil is distinct from the column position of each other coil element of the combined coil. The coil elements of a combined coil are disjoint from the coil elements of each other combined coil. Each combined coil is configured to connect with a corresponding member of the plurality of Rx channels of the MRI system. Each combined coil is electromagnetically decoupled from each other combined coil. In one embodiment, members of the plurality of coil elements are overlapped to minimize mutual electromagnetic coupling between the members of the plurality of coil elements.

In one embodiment, the coil elements of a combined coil are connected in series. FIGS. 3 and 5 illustrate exemplary techniques for connecting coil elements of a combined coil in series. In another embodiment, the coil elements of a combined coil are connected according to a star topology. FIG. 4 illustrates an exemplary technique for connecting the coil elements of a combined coil according to a star topology.

In one embodiment, the MRI RF coil array further includes a mode control circuit configured to disable a coil element of a combined coil. FIG. 5 illustrates an exemplary mode control circuit 510 suitable for use in embodiments described herein. The mode control circuit may, by disabling a coil element of a combined coil, control the MRI RF coil array to switch from a first mode (e.g., head mode) to a second mode (e.g., brain mode). The mode control circuit may receive a DC bias current, a signal, or be otherwise controlled by an MRI system.

In one embodiment, members of the plurality of coil elements are configured to use pre-amplifiers for decoupling. In one embodiment, a combined coil is configured to use a pre-amplifier for decoupling. In another embodiment, members of the plurality of coil elements are configured to use capacitive elements for decoupling.

Figure 13:
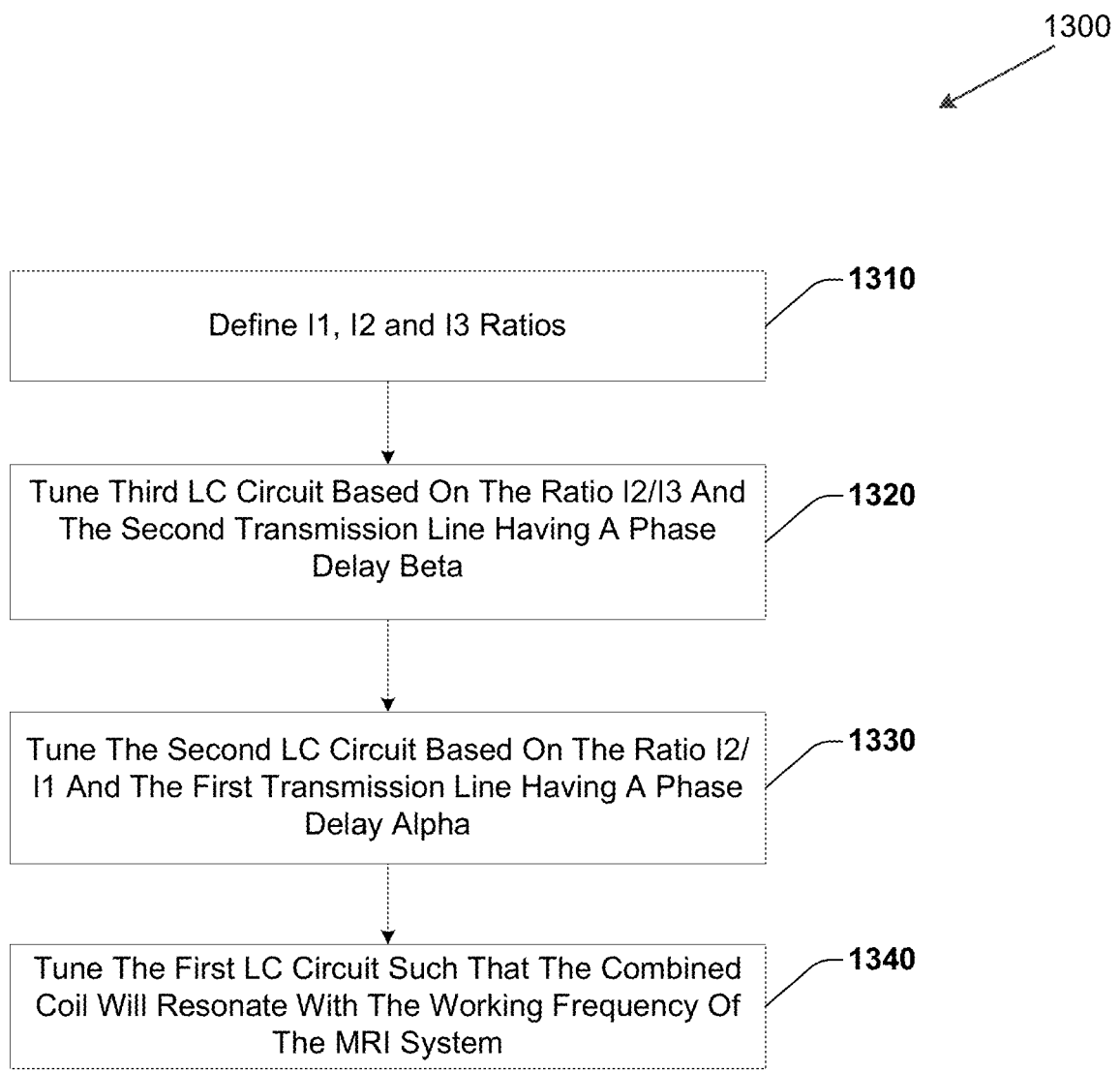
FIG. 13 is a flow diagram of a method for tuning coil elements combined as one combined element.

Embodiments described herein include methods for tuning coil elements combined to operate as one combined coil. FIG. 13 illustrates an example method 1300 that may be employed to tune a plurality of MRI RF coil array elements configured to operate as a single combined coil. Method 1300 may be employed to tune MRI RF coil arrays described herein, including MRI RF coil arrays 700, 800, 900, 1000, or 1100. Recall that a combined coil is configured to connect with an Rx channel or a Tx/Rx channel for pTx of a multiple channel MRI system. FIG. 3 illustrates three coils connected in series and configured to operate as a single combined coil. In this embodiment, a single combined coil includes a first LC circuit (e.g., coil 1 of FIG. 3) having a first current I1, a second LC circuit (e.g., coil 2 of FIG. 3) having a second current I2, the second LC circuit electrically connected by a first transmission line in series with the first LC circuit, the first transmission line having an intrinsic impedance, and a phase delay alpha, and a third LC circuit (e.g., coil 3 of FIG. 3) having a third current I3, the third LC circuit electrically connected by a second transmission line in series with the second LC circuit. The second transmission line has an intrinsic impedance, and a phase delay beta.

Method 1300 includes, at 1310, defining the I1, I2 and I3 ratios.

Method 1300 also includes, at 1320, tuning the third LC circuit based on the ratio I2/I3 and the second transmission line having a phase delay beta.

Method 1300 also includes, at 1330, tuning the second LC circuit based on the ratio I2/I1 and the first transmission line having a phase delay alpha.

Method 1300 further includes, at 1340, tuning the first LC circuit such that the combined coil will resonate with the working frequency of the MRI system.

In one embodiment of method 1300, the intrinsic impedance of the first transmission line does not equal the intrinsic impedance of the second transmission line. In another embodiment, the intrinsic impedances may be equal.

In one embodiment, the first transmission line or the second transmission line is a coaxial cable, or a flexible coaxial cable. In another embodiment, the first transmission line or the second transmission line is another type of conductive material.

While in this embodiment of method 1300, the LC circuits are connected in series, in another embodiment, the LC circuits may be connected according to a star topology.

FIG. 4 illustrates a coil block diagram of an exemplary three-loop coil 400 in which LC circuits (i.e., coils 1, 2, and 3) are connected according to a star topology. In this embodiment, tuning is similar to the series example, but is based on the I2/I1 and I3/I1 ratios. The second LC circuit is tuned based on the I2/I1 ratio. Tuning I2 changes the I2/I1 ratio for a given transmission line. The third LC circuit is tuned based on the I3/I1 ratio. Finally, the first LC circuit is tuned such that the entire combined coil will resonate with the working frequency of the MRI system.

In another embodiment, a single combined coil may contain more than three LC circuits. In this embodiment, the additional LC circuits are combined and tuned following the approaches described herein with respect to the first, second, and third LC circuits.

Figure 12:
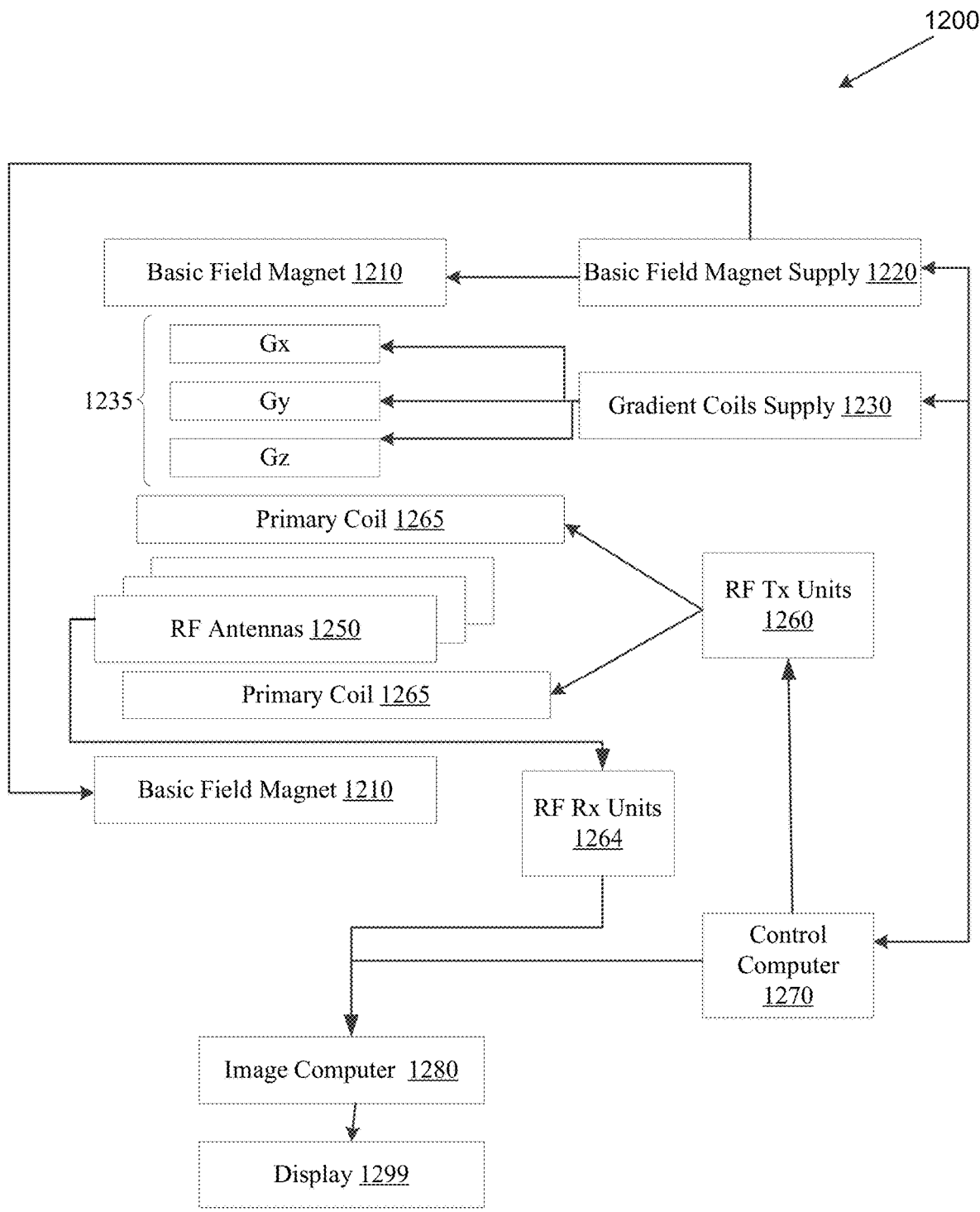
FIG. 12 illustrates an example MRI apparatus.

FIG. 12 illustrates an example MRI apparatus 1200 that may be configured with example MRI RF coils, coil elements, coil arrays, or circuitry as described herein. Apparatus 1200 includes a basic field magnet(s) 1210 and a basic field magnet supply 1220. Ideally, the basic field magnets 1210 would produce a uniform $B_0$ field. However, in practice, the $B_0$ field may not be uniform, and may vary over an object being imaged by the MRI apparatus 1200. MRI apparatus 1200 may include gradient coils 1235 configured to emit gradient magnetic fields like $G_x$, $G_y$, and $G_z$. The gradient coils 1235 may be controlled, at least in part, by a gradient coils supply 1230. In some examples, the timing, strength, and orientation of the gradient magnetic fields may be controlled, and thus selectively adapted during an MRI procedure.

MRI apparatus 1200 may include a primary coil 1265 configured to generate RF pulses. The primary coil 1265 may be a whole body coil. The primary coil 1265 may be, for example, a birdcage coil. The primary coil 1265 may be controlled, at least in part, by an RF transmission unit 1260. RF transmission unit 1260 may provide a signal to primary coil 1265.

MRI apparatus 1200 may include a set of RF antennas 1250. RF antennas 1250 may be configured to generate RF pulses and to receive resulting magnetic resonance signals from an object to which the RF pulses are directed. RF antennas 1250 may be configured to inductively couple with primary coil 1265 and generate RF pulses and to receive resulting magnetic resonance signals from an object to which the RF pulses are directed. In one embodiment, a member of the set of RF antennas 1250 may be fabricated from flexible coaxial cable, or other conductive material. The set of RF antennas 1250 may be connected with an RF receive unit 1264.

The gradient coils supply 1230 and the RF transmission units 1260 may be controlled, at least in part, by a control computer 1270. The magnetic resonance signals received from the set of RF antennas 1250 can be employed to generate an image, and thus may be subject to a transformation process like a two dimensional fast Fourier transform (FFT) that generates pixilated image data. The transformation can be performed by an image computer 1280 or other similar processing device. The image data may then be shown on a display 1299. RF Rx Units 1264 may be connected with control computer 1270 or image computer 1280. While FIG. 12 illustrates an example MRI apparatus 1200 that includes various components connected in various ways, it is to be appreciated that other MRI apparatus may include other components connected in other ways.

In one embodiment, MRI apparatus 1200 includes control computer 1270. In one example, a member of the set of RF antennas 1250 may be individually controllable by the control computer 1270. A member of the set of RF antennas 1250 may be an example MRI RF coil array including, for example, MRI RF coil arrays 700-1100. For example, MRI RF coil array 700, may be implemented as part of RF antennas 1250 illustrated in FIG. 12. In another embodiment, RF antennas 1250 may include MRI RF coil array 800, 900, 1000, or 1100. In another embodiment, the set of RF antennas 1250 may include other, different combinations of example embodiments of MRI RF coil arrays, elements or example embodiments of MRF RF coil arrays, including single-layer MRI RF coil elements or single-layer MRI RF coil arrays. In one embodiment, control computer 1270 may provide a signal or DC bias current to control a mode control circuit (e.g., mode control circuit 510).

An MRI apparatus may include, among other components, a controller (e.g., control computer 1270) and an RF coil (e.g., primary coil 1265) operably connected to the controller. The controller may provide the RF coil with a current, a voltage, or a control signal. The coil may be a whole body coil. The coil may inductively couple with an example MRI RF coil element, or MRI RF coil array, as described herein, including MRI RF coil arrays 700-1100.

Control computer 1270 may provide a DC bias current, or control a DC bias control circuit to control the application of a DC bias current to MRI RF coil arrays or elements that may be part of antennas 1250. For example, control computer 1270 may provide a DC bias current to mode control circuitry 1150 to control MRI RF coil array 1100 to operate in brain mode or full head mode.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Circuit", as used herein, includes but is not limited to hardware, firmware, or combinations of each to perform a function(s) or an action(s), or to cause a function or action from another circuit, logic, method, or system. Circuit may include a software controlled microprocessor, a discrete logic (e.g., ASIC), an analog circuit, a digital circuit, a programmed logic device, a memory device containing instructions, and other physical devices. A circuit may include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage device may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A magnetic resonance imaging (MRI) radio frequency (RF) coil array configured to operate in a parallel transmit (pTx) mode or a receive (Rx) mode for use in an MRI system, the MRI RF coil array comprising:
   a plurality of coil elements configured for transmitting or receiving RF signals arranged in two rows, where a first row includes four coil elements, and where a second, different row includes four different coil elements;
   where a first coil element of the first row is electrically connected to a second coil element of the second row, where the first coil element of the first row and the second coil element of the second row are configured to operate as a first combined coil configured to connect to a corresponding first Rx channel of the MRI system;
   where a second coil element of the first row is electrically connected to a third coil element of the second row, where the second coil element of the first row and the third coil element of the second row are configured to operate as a second combined coil configured to connect to a corresponding second Rx channel of the MRI system;
   where a third coil element of the first row is electrically connected to a fourth coil element of the second row, where the third coil element of the first row and the fourth coil element of the second row are configured to operate as a third combined coil configured to connect to a corresponding third Rx channel of the MRI system;
   where a fourth coil element of the first row is electrically connected to a first coil element of the second row, where the fourth coil element of the first row and the first coil element of the second row are configured to operate as a fourth combined coil configured to connect to a corresponding fourth Rx channel of the MRI system; and
   where the first combined coil, the second combined coil, the third combined coil, and the fourth combined coil are electromagnetically decoupled from each other.

2. The MRI RF coil array of claim 1, where the first combined coil, the second combined coil, the third combined coil, and the fourth combined coil are electromagnetically decoupled from each other using an overlap decoupling approach.

3. The MRI RF coil array of claim 1, where the MRI RF coil array is a single layer MRI RF coil array.

4. The MRI RF coil array of claim 1, where the coil elements are further arranged in columns, where the MRI RF coil array is configured in a substantially cylindrical shape, where the columns are aligned with a $B_0$ field of the MRI system.

5. The MRI RF coil array of claim 1, where the coil elements are further arranged in columns, where the MRI RF coil array is configured in a flat shape, where the columns are aligned with a $B_0$ field of the MRI system.

6. A magnetic resonance imaging (MRI) radio frequency (RF) coil array configured to operate in a parallel transmit (pTx) mode or a receive (Rx) mode for use in an MRI system, the MRI RF coil array comprising:
   a plurality of coil elements configured for transmitting or receiving RF signals arranged in three rows, where each row includes four coil elements;
   where a first coil element of the first row is electrically connected to a second coil element of the second row, where the second coil element of the second row is electrically connected to a fourth coil element of the third row, where the first coil element of the first row, the second coil element of the second row, and the fourth coil element of the third row are configured operate as a first combined coil configured to connect to a corresponding first Rx channel of the MRI system;
   where a second coil element of the first row is electrically connected to a third coil element of the second row, where the third coil element of the second row is electrically connected to a first coil element of the third row, and where the second coil element of the first row, the third coil element of the second row, and the first coil element of the third row are configured operate as a second combined coil configured to connect to a corresponding second Rx channel of the MRI system;
   where a third coil element of the first row is electrically connected to a fourth coil element of the second row, where the fourth coil element of the second row is electrically connected with a second coil element of the third row, and where the third coil element of the first row, the fourth coil element of the second row, and the second coil element of the third row are configured operate as a third combined coil configured to connect to a corresponding third Rx channel of the MRI system;

where a fourth coil element of the first row is electrically connected to a first coil element of the second row, where the first coil element of the second row is electrically connected with a third coil element of the third row, and where the fourth coil element of the first row, the first coil element of the second row, and the third coil element of the third row are configured operate as a fourth combined coil configured to connect to a corresponding fourth Rx channel of the MRI system; and where the first combined coil, the second combined coil, the third combined coil, and the fourth combined coil are electromagnetically decoupled from each other.

7. The MRI RF coil array of claim 6, where the first combined coil, the second combined coil, the third combined coil, and the fourth combined coil are electromagnetically decoupled from each other using an overlap decoupling approach.

8. The MRI RF coil array of claim 6, where the coil elements comprising the first combined coil are connected in series, where the coil elements comprising the second combined coil are connected in series, where the coil elements comprising the third combined coil are connected in series, and where the coil elements comprising the fourth combined coil are connected in series.

9. The MRI RF coil array of claim 6, where the coil elements comprising the first combined coil are connected in a star topology, where the coil elements comprising the second combined coil are connected in a star topology, where the coil elements comprising the third combined coil are connected in a star topology, and where the coil elements comprising the fourth combined coil are connected in a star topology.

10. The MRI RF coil array of claim 6, where the coil elements are further arranged in columns, where the MRI RF coil array is configured in a cylindrical shape, where the columns are aligned with a $B_0$ field of the MRI system.

11. The MRI RF coil array of claim 6, where the coil elements are further arranged in columns, where the MRI RF coil array is configured in a flat shape, where the columns are aligned with a $B_0$ field of the MRI system.

12. The MRI RF coil array of claim 6, where the MRI RF coil array is a single layer MRI RF coil array.

13. A magnetic resonance imaging (MRI) radio frequency (RF) coil array configured to operate in a parallel transmit (pTx) mode or a receive (Rx) mode in an MRI system, the MRI system having a plurality of Rx channels, where the MRI system generates a $B_0$ field, the MRI RF coil array comprising:

a plurality of coil elements configured for transmitting or receiving RF signals, the coil elements arranged in a M by N array, where M represents the number of rows in the array, and N represents the number of columns in the array, where N is greater than or equal to M, where both M and N are greater than one, where the number of columns corresponds with the number of Rx channels in the MRI system, and where the columns are aligned with the $B_0$ field;

where the plurality of coil elements are configured as a plurality of combined coils, where the number of combined coils corresponds with the number of columns, where a combined coil comprises a coil element in a first row of the M by N array that is electrically connected with a coil element in each of the remaining rows, where the column position of each coil element of the combined coil is distinct from the column position of each other coil element of the combined coil, where the coil elements of a combined coil are disjoint from the coil elements of each, other combined coil;

where each combined coil is configured to connect with a corresponding member of the plurality of Rx channels; and where each combined coil is electromagnetically decoupled from each, other, combined coil.

14. The MRI RF coil array of claim 13, where the coil elements of a combined coil are connected in series.

15. The MRI RF coil array of claim 13, where the coil elements of a combined coil are connected in a star topology.

16. The MRI RF coil array of claim 13, where members of the plurality of coil elements are overlapped to minimize mutual electromagnetic coupling between the members of the plurality of coil elements.

17. The MRI RF coil array of claim 13, where members of the plurality of coil elements are configured to use pre-amplifiers for decoupling.

18. The MRI RF coil array of claim 13, where members of the plurality of coil elements are configured to use capacitive elements for decoupling.

19. The MRI RF coil array of claim 13, further including a mode control circuit configured to disable a coil element of a combined coil.

20. A method for tuning a plurality of magnetic resonance imaging (MRI) radio frequency (RF) coil array elements configured to operate as a single combined coil, the single combined coil configured to connect with a receive (Rx) channel of a multiple channel MRI system, where the single combined coil comprises:

a first LC circuit having a first current I1, a second LC circuit having a second current I2, the second LC circuit electrically connected by a first transmission line in series with the first LC circuit, the first transmission line having an intrinsic impedance, and a phase delay alpha; and a third LC circuit having a third current I3, the third LC circuit electrically connected by a second transmission line in series with the second LC circuit, the second transmission line having an intrinsic impedance, and a phase delay beta;

the method comprising:

defining the I1, I2 and I3 ratios;

tuning the third LC circuit based on the ratio I2/I3 and the second transmission line having a phase delay beta;

tuning the second LC circuit based on the ratio I2/I1 and the first transmission line having a phase delay alpha; and tuning the first LC circuit such that the single combined coil will resonate with a working frequency of the MRI system.

21. The method of claim 20, where the intrinsic impedance of the first transmission line does not equal the intrinsic impedance of the second transmission line.

22. The method of claim 20, where the first transmission line or the second transmission line is a coaxial cable, or a flexible coaxial cable.

23. A method for tuning a plurality of magnetic resonance imaging (MRI) radio frequency (RF) coil array elements configured to operate as a single combined coil, the single combined coil configured to connect with a receive (Rx) channel of a multiple channel MRI system, where the single combined coil comprises:

a first LC circuit having a first current I1, a second LC circuit having a second current I2, the second LC circuit electrically connected by a first transmission line in a star topology with the first LC circuit, the first transmission line having an intrinsic impedance, and a phase delay alpha; and a third LC circuit having a third current I3, the third LC circuit electrically connected by a second transmission line in a star topology with the first LC circuit, the second transmission line having an intrinsic impedance, and a phase delay beta;

the method comprising:

defining the I1, I2 and I3 ratios;

tuning the third LC circuit based on the ratio of I3/I1 and the second transmission line having a phase delay beta;

tuning the second LC circuit based on the ratio of I2/I1 and the first transmission line having a phase delay alpha; and tuning the first LC circuit such that the single combined coil will resonate with a working frequency of the MRI system.

24. The method of claim 23, where the intrinsic impedance of the first transmission line does not equal the intrinsic impedance of the second transmission line.

25. The method of claim 23, where the first transmission line or the second transmission line is a coaxial cable, or a flexible coaxial cable.

\* \* \* \* \*